(12) United States Patent
Li

(10) Patent No.: US 11,749,689 B2
(45) Date of Patent: Sep. 5, 2023

(54) ARRAY SUBSTRATE MOTHER BOARD, ARRAY SUBSTRATE, DISPLAY PANEL AND DISPLAY DEVICE

(71) Applicant: Xiamen Tianma Micro-Electronics Co., Ltd., Xiamen (CN)

(72) Inventor: Kui Li, Wuhan (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 172 days.

(21) Appl. No.: 17/361,243

(22) Filed: Jun. 28, 2021

(65) Prior Publication Data

US 2021/0358373 A1  Nov. 18, 2021

(30) Foreign Application Priority Data

Feb. 4, 2021   (CN) .......................... 202110158827.5

(51) Int. Cl.

| H01L 27/14 | (2006.01) |
|---|---|
| H01L 27/12 | (2006.01) |
| G06F 1/18 | (2006.01) |
| G09G 3/20 | (2006.01) |
| G02F 1/1362 | (2006.01) |
| G02F 1/1368 | (2006.01) |

(52) U.S. Cl.
CPC ........ *H01L 27/124* (2013.01); *H01L 27/1255* (2013.01); *G02F 1/13685* (2021.01); *G02F 1/136213* (2013.01); *G06F 1/184* (2013.01); *G09G 3/20* (2013.01); *G09G 2300/0876* (2013.01)

(58) Field of Classification Search
CPC ............... H01L 27/124; H01L 27/1255; G02F 1/136213; G02F 1/13685; G06F 1/184; G09G 3/20; G09G 2300/0876; G09G 2300/023
USPC ..................................................... 257/59, 72
See application file for complete search history.

(56) References Cited

U.S. PATENT DOCUMENTS 11,387,310 B2 *  7/2022  Yang ................... H01L 27/3265

FOREIGN PATENT DOCUMENTS

| CN | 108172594 A | 6/2018 |
|---|---|---|
| CN | 110677982 A | 1/2020 |
| CN | 110854157 A | 2/2020 |

* cited by examiner

*Primary Examiner* — Tan N Tran
(74) *Attorney, Agent, or Firm* — KILPATRICK TOWNSEND & STOCKTON, LLP

(57) ABSTRACT

Provided are an array substrate mother board, an array substrate, a display panel and a display device. The array substrate mother board includes array substrates, the array substrate includes a component disposing area; the array substrate includes a base substrate and a drive circuit layer, the drive circuit layer includes a first metal layer, and the first metal layer includes capacitor plates arranged in an array along the first direction and along the second direction; the plurality of array substrates include first-type array substrates, and the plurality of first-type array substrates are arranged along the first direction and are adjacent to a boundary extending along a first direction in the mother board of the array substrate.

20 Claims, 16 Drawing Sheets

ARRAY SUBSTRATE MOTHER BOARD, ARRAY SUBSTRATE, DISPLAY PANEL AND DISPLAY DEVICE

CROSS-REFERENCE TO RELATED APPLICATION

This application claims priority to Chinese Patent Application No. 202110158827.5 filed Feb. 4, 2021, the disclosure of which is incorporated herein by reference in its entirety.

FIELD

The embodiments of the present disclosure relate to the field of display technology, and, in particular, to an array substrate mother board, an array substrate, a display panel, and a display device.

BACKGROUND

With the development of display technology, in order to obtain a higher ratio, various display panels such as notch screens, water-drop screens, and dig-hole screens occur. The screens all set an opening on the display panel, which is not provided with pixel units and various signal wires, instead, it is used to place imaging components such as cameras and fingerprint recognition modules.

However, it can be discover that split-screens may occur on two sides of the opening, which seriously affect display effect.

SUMMARY

The present disclosure provides an array substrate mother board, an array substrate, a display panel and a display device to improve split-screen phenomenon of the first sub-area and the second sub-area on two sides of the component disposing area, and to improve display effect.

In one embodiment of the present disclosure provides an array substrate mother board, the array substrate mother board includes array substrates disposed in an array. Each array substrate includes a first boundary extending along a first direction and a second boundary extending along a second direction. The first direction intersects the second direction.

The array substrate includes a component disposing area.

The array substrate further includes a base substrate and a drive circuit layer, the drive circuit layer includes a gate metal layer and a first metal layer, and the first metal layer is disposed on the side of the gate metal layer facing away from the base substrate; and the first metal layer includes capacitor plates arranged in an array along the first direction and the second direction.

The plurality of array substrates includes first-type array substrates, and the plurality of first-type array substrates are arranged along the first direction and are adjacent to a boundary extending along the first direction in the array substrate mother board; among the plurality of first-type array substrates, along the second direction, two sides of the component disposing area include a first sub-area and a second sub-area, the first sub-area and the second sub-area each include the plurality of capacitor plates, and along the second direction, any two capacitor plates of the plurality of capacitor plates are not connected on the first metal layer.

In one embodiment of the present disclosure also provides an array substrate. The array substrate includes a first boundary extending in a first direction and a second boundary extending in a second direction and the first direction intersect the second direction.

The array substrate includes a component disposing area.

The array substrate further includes a base substrate and a drive circuit layer, the drive circuit layer includes a gate metal layer and a first metal layer, the first metal layer is disposed on a side of the gate metal layer facing away from the base substrate; and the first metal layer includes capacitor plates arranged in an array along the first direction and along the second direction;

In the array substrate, along the second direction, two sides of the component disposing area include a first sub-area and a second sub-area, the first sub-area and the second sub-area each include the capacitor plates, and along the second direction, any two capacitor plates of the plurality of capacitor plates are not connected on the first metal layer.

In one embodiment of the present disclosure also provides a display panel, which includes the array substrate described in other embodiments.

In one embodiment of the present disclosure also provides a display device, which includes the display panel described in other embodiments.

DETAILED DESCRIPTION

Figure 1:
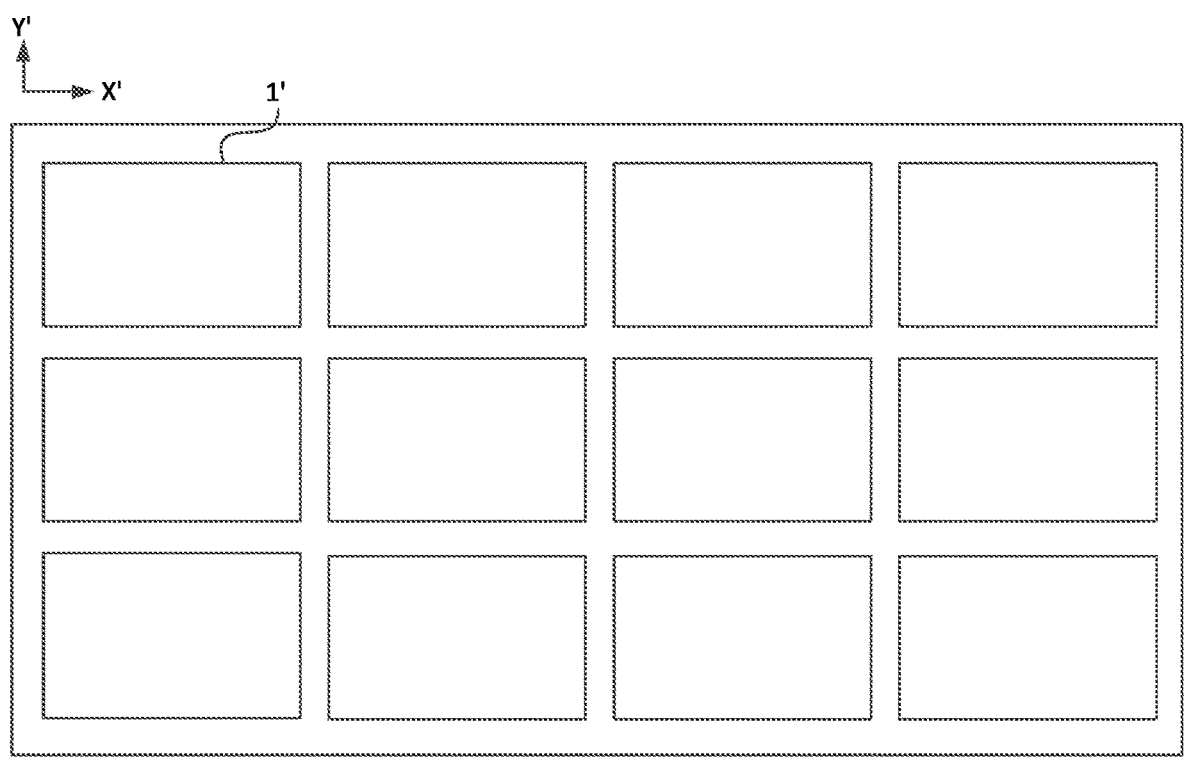
FIG. 1 is a schematic structure view of an array substrate mother board provided by the related art.

Hereinafter the present disclosure will be further described in detail in conjunction with the drawings and embodiments. It is to be understood that the embodiments set forth herein are merely intended to illustrate and not to limit the present disclosure. Additionally, it is to be noted that for ease of description, merely part, not all, of the structures related to the present disclosure are illustrated in the drawings.

Figure 2:
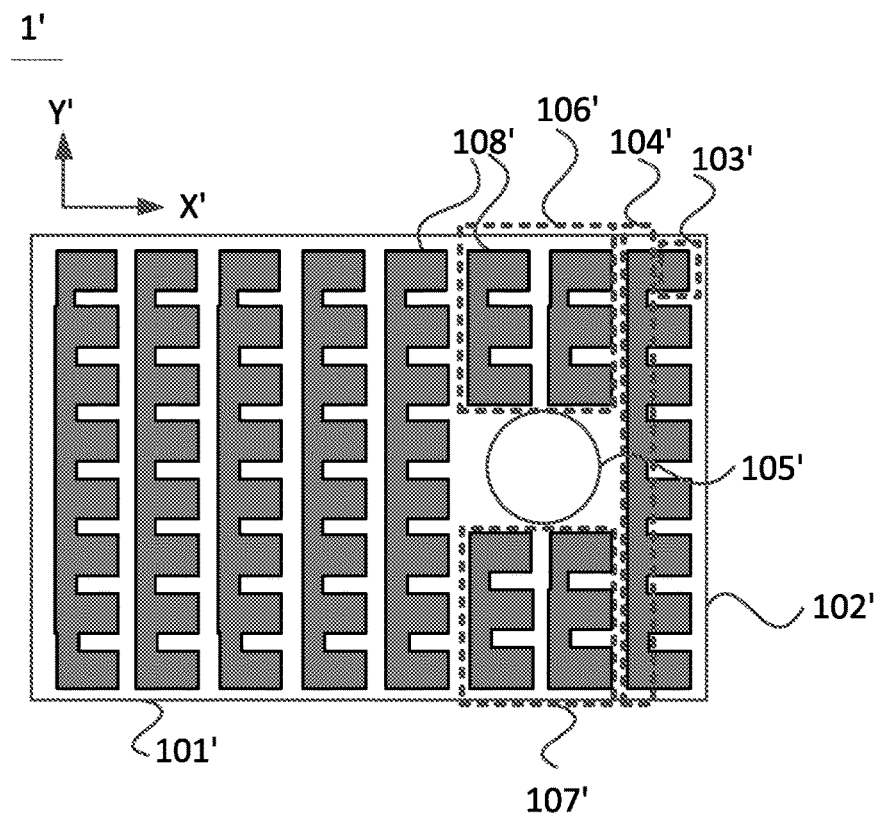
FIG. 2 is a schematic structure view of an array substrate in FIG. 1.

FIG. 1 is a schematic structure view of an array substrate mother board provided by the related art. FIG. 2 is a schematic structure view of an array substrate in FIG. 1. With reference to FIG. 1, the array substrate mother board includes array substrates 1' arranged in an array, and the array substrate 1' includes a first boundary 101' extending in a first direction X' and a second boundary 102' extending in a second direction Y', the first direction X' intersects the second direction Y'. The array substrate 1' further includes a base substrate, a gate metal layer, and a capacitor metal layer. The capacitor metal layer is positioned on a side of the gate metal layer facing away from the base substrate. The capacitor metal layer includes capacitor plates 103' and a power signal line 104' extending in the direction Y', the capacitor plate 103' and the power signal line 104' are connected. The plurality of array substrates 1' include first-type array substrates 1', and the plurality of first-type array substrates 1' are arranged along the first direction X' and are adjacent to a boundary extending along the first direction X' in the mother board of the array substrate 1', the first-type array substrate 1' further includes a component disposing area 105', along the second direction Y', two sides of the component disposing area 105' include a first sub-area 106' and a second sub-area 107'. It is found by the applicant that when the first-type array substrate 1' is subsequently applied to a display panel, split-screens may occur in the first sub-area 106' and the second sub-area 107'.

According to researches of the applicant, the reason for split-screens in the first sub-area 106' and the second sub-area 107' is that the array substrate mother board is likely to accumulate static charges on the boundary in the manufacturing process; in addition, the capacitor metal blocks 108' with a larger area formed by the capacitor plates 103' that are connected to each other by the power signal line 104' are easier to accumulate static charges. In the first-type array substrate 1', since the first sub-area 106' is closer to the boundary of the array substrate mother board than the second sub-area 107', the amount of static charges accumulated in the capacitor metal blocks 108' in the first sub-area 106' is greater than that in the second sub-area 107', in other words, the amount of static charges accumulated on the capacitor plate 103' in the first sub-area 106' is greater than that in the second sub-area 107'. Before the subsequent film layer of the capacitor metal layer is fabricated, the capacitor metal blocks 108' in the capacitor metal layer are in a floated state, and the static charges accumulated on the capacitor metal blocks 108' cannot be exported, the static charges accumulated on each capacitor plate 103' may have an impact on the structure of the drive transistor below it, with the effect of adding a bias voltage to the drive transistor, causing the characteristic shift of the drive transistor. Since the amount of static charges accumulated on the capacitor plates 103' in the first sub-area 106' is greater than that accumulated on the capacitor plate 103' in the second sub-area 107', as a result, static charge accumulation has different impact on the drive transistors in the first sub-area 106' and the second sub-area 107', and finally the first sub-area 106' and the second sub-area 107' are split-screened. Generally speaking, in a drive circuit, the drive transistor is disposed in series on the transmission path of a power signal (PVDD signal), and the gate of the drive transistor is written with a data voltage signal, as the data voltage signal is written, the gate potential of the drive transistor changes.

In view of this, an embodiment of the present disclosure provides an array substrate mother board, which includes array substrates arranged in an array. The array substrate includes a first boundary extending in a first direction and a second boundary extending in a second direction, the first direction intersects the second direction; and the array substrate includes a component disposing area. The array substrate further includes a base substrate and a drive circuit layer, the drive circuit layer includes a gate metal layer and a first metal layer, and the first metal layer is disposed on a side of the gate metal layer facing away from the base substrate. The first metal layer includes capacitor plates arranged in an array along a first direction and a second direction. The plurality of array substrates includes first-type array substrates, and the plurality of first-type array substrates are arranged along the first direction and are adjacent to a boundary extending along the first direction in the mother board of the array substrate. Among the plurality of first-type array substrates, along the second direction, two sides of the component disposing area include a first sub-area and a second sub-area, the first sub-area and the second sub-area include capacitor plates, and along the second direction, any two capacitor plates are not connected on the first metal layer. For the array substrate mother board of the above embodiments, the first sub-area and the second sub-area on two sides of the component disposing area include capacitor plates, and along the second direction, any two capacitor plates are not connected on the first metal layer, which can reduce the amount of static charges accumulated on the capacitor plates in the first sub-area and the second sub-area; meanwhile, the difference of the static charges accumulated on the capacitor plates in the first sub-area and the second sub-area can be reduced. Exemplarily, in the first sub-area and the second sub-area, along the first direction, any two capacitor plates are not connected on the first metal layer, that is, the capacitor plates are mutually independent, and there is a gap between each two capacitor plates, so that capacitor metal blocks with a large-area may not form. When the first sub-area is adjacent to the boundary of the array substrate mother board, and/or the second sub-area is adjacent to the boundary of the array substrate mother board, there are a small number of capacitor plates adjacent to the boundary of the mother board of the array substrate in the first sub-area and/or the second sub-area, while the number of capacitor plates that are not adjacent to the boundary of the array substrate motherboard is large; since there is no difference of whether the capacitor plates are adjacent to the array substrate mother board as the capacitor plates in the first sub-area are not adjacent to the boundary of the array substrate mother board and the capacitor plates in the second sub-area are not adjacent to the boundary of the array substrate mother board, the ability to attract static charges is almost the same with minimal difference in the amount of static charges accumulated on them. In addition, with a small area, a small number of capacitor plates adjacent to the boundary of the array substrate mother board are not easy to attract static charges by themselves, and their ability to accumulate static charges is weak. Therefore, the amount of static charges accumulated on the capacitor plates that are adjacent to the boundary of the array substrate mother board is also small; in this way, the difference in the amount of static charges accumulated on the capacitor plates that are not adjacent to the boundary of the array substrate mother board is small. In summary, the difference in static charges accumulated on the capacitor plates in the first sub-area and the second sub-area is relatively small, and to solve the problem that due to the large difference in the amount of static charges accumulated on the capacitor plates in the first sub-area and the second sub-area, the bias voltage applied to the source electrode and the drain electrode of the drive transistor in the corresponding areas is different, leading to inconsistency in characteristic shift of the drive transistors, further causing split-screens of the display panel, which can solve split-screens of the first sub-area and the second sub-area to improve display effect.

The present disclosure is to be clearly and completely described below with reference to the accompanying drawings of the embodiments. Apparently, the embodiments described above are a part (not all) of the embodiments of the present disclosure.

Figure 3:
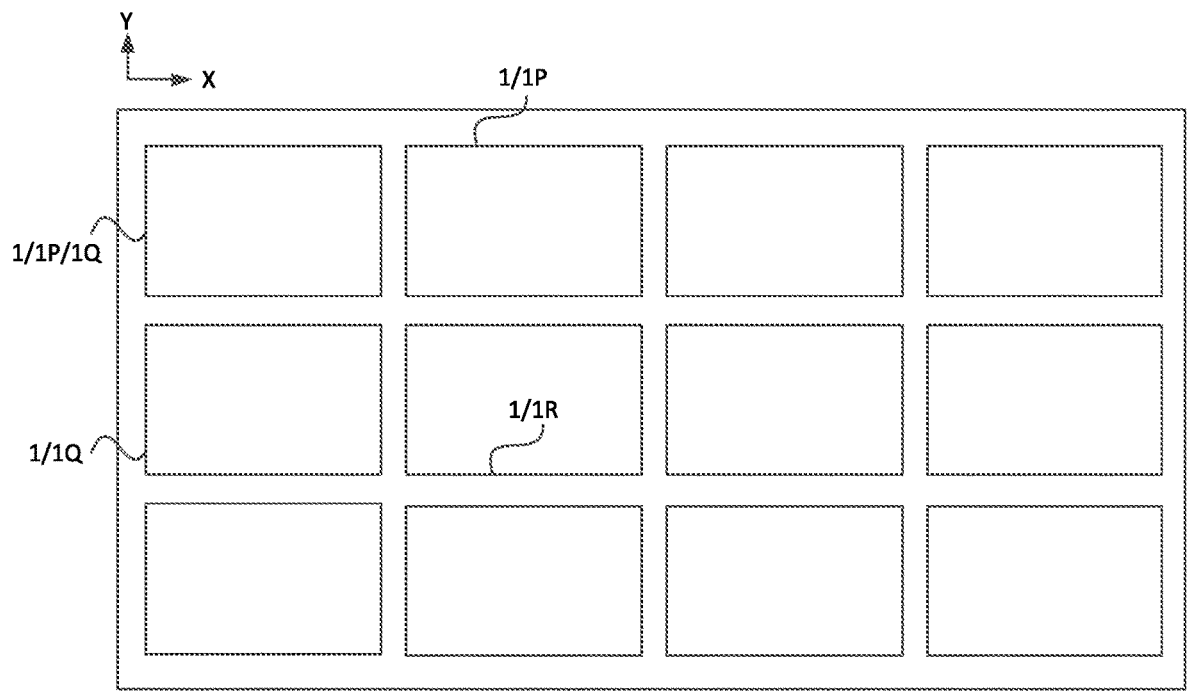
FIG. 3 is a schematic structure view of an array substrate mother board provided by an embodiment of the present disclosure.
Figure 4:
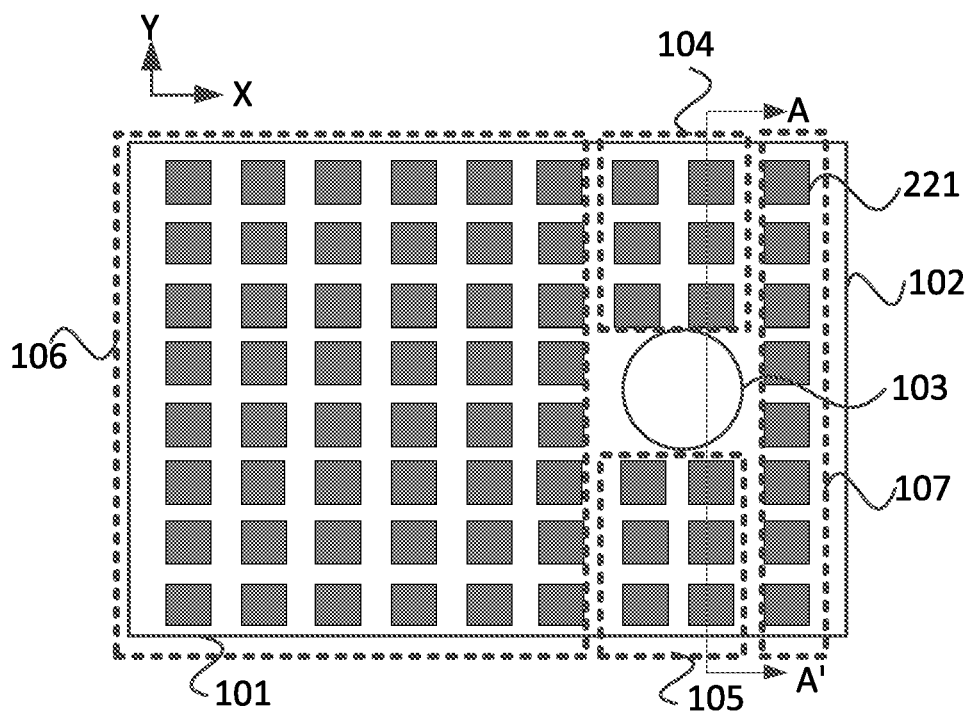
FIG. 4 is a schematic structure view of a first-type array substrate in FIG. 3.
Figure 5:
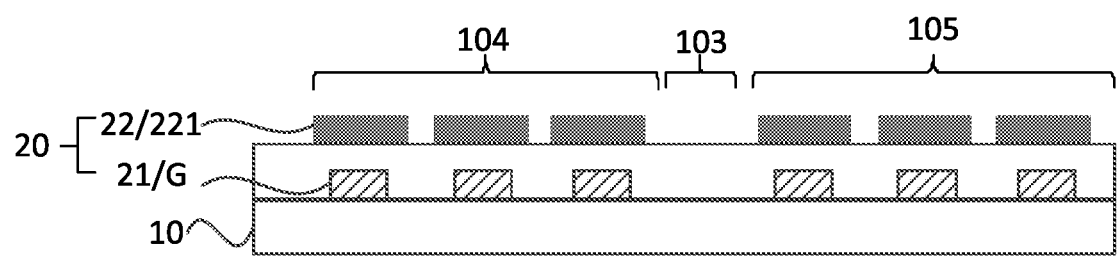
FIG. 5 is a cross-sectional view along the AA' direction of FIG. 3.
Figure 6:
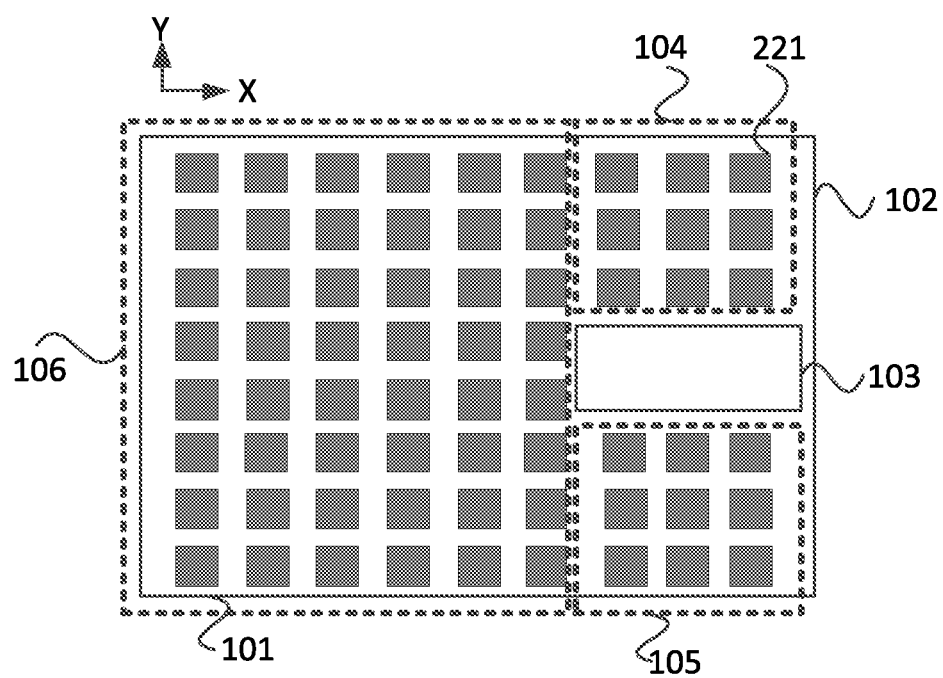
FIG. 6 is another schematic structure view of the first-type array substrate in FIG. 3.

FIG. 3 is a schematic structure view of an array substrate mother board provided by an embodiment of the present disclosure. FIG. 4 is a schematic structure view of a first-type array substrate in FIG. 3. FIG. 5 is a cross-sectional view of along the AA' direction of FIG. 4. FIG. 6 is another schematic structure view of the first-type array substrate in FIG. 3. Among them, the difference between FIG. 4 and FIG. 6 lies in the position and shape of the component disposing area 103. With reference to FIG. 3 to FIG. 5, the array substrate mother board includes array substrates 1 arranged in an array. The array substrate 1 includes a first boundary 101 extending in a first direction X and a second boundary 102 extending in a second direction Y, the first direction X intersects the second direction Y; the array substrate 1 includes a component disposing area 103; and the array substrate 1 further includes a base substrate 10 and a drive circuit layer 20. The drive circuit layer 20 includes a gate metal layer 21 and a first metal layer 22. The first metal layer 22 is disposed on a side of the gate metal layer 21 facing away from the base substrate 10. The first metal layer 22 includes capacitor plates 221 arranged in an array along the first direction X and the second direction Y. The plurality of array substrates 1 includes first-type array substrates 1P, and the plurality of first-type array substrates 1P are arranged along the first direction X and are adjacent to a boundary extending along the first direction X in the array substrate mother board. Among the plurality of first-type array substrates 1P, along the second direction Y, two sides of the component disposing area 103 include a first sub-area 104 and a second sub-area 105, the first sub-area 104 and the second sub-area 105 include capacitor plates 221. In the second direction Y, any two capacitor plates 221 are not connected on the first metal layer 22.

In an embodiment, after the preparation of the array substrate mother board is completed, array substrates 1 can be independently obtained by cutting. It should be noted that, FIG. 3 only exemplarily shows that, the array substrate mother board includes nine array substrates 1, a ration of a number of the first-type array substrates 1P to a total number of the array substrate 1 is ⅔, and the length of the first boundary 101 is greater than that of the second boundary 102; however, it is not limited hereto, it can be set according to actual situations. The size, proportion of the array substrate mother board and the number of array substrates 1 in the array substrate mother board, etc. are not limited to the present disclosure. For example, in other embodiments, the array substrates 1 in the array substrate mother board each are the first-type array substrate 1P, and the length of the first boundary 101 is less than or equal to that of the second boundary 102. It should be noted that, that the first-type array substrate 1P is adjacent to the boundary extending along the first direction X in the array substrate mother board may be a case that the first-type array substrate 1P includes a boundary adjacent to the boundary extending in the first direction X in the array substrate mother board, or a case that the first-type array substrate 1P may be close to the array substrate extending in the first direction X, and there is a distance between the first-type array substrate 1P and the array substrate.

In an embodiment, the component disposing area 103 can be an imaging component disposing area or an acoustic component disposing area. In an embodiment, the component disposing area 103 may not be provided with pixel units, and the subsequent component disposing area 103 may be provided with blind holes or through holes to accommodate imaging components (such as cameras, etc.) or acoustic components (such as speakers, microphones, etc.). In an embodiment, the component disposing area 103 can also be provided with pixel units, and the light transmittance of the component disposing area 103 is greater than that of the non-component disposing area in the array substrate; in the direction perpendicular to the light emitting surface of the pixel unit, the component disposing area 103 at least partially covers the imaging component (e.g., cameras or other components that require optical signals). Exemplarily, light transmittance of the component disposing area 103 is greater than light transmittance of the non-component disposing area, which can be achieved by reducing the pixel unit density in the component disposing area 103, reducing film thickness or metal area of the component disposing area in such a way as not to be limited hereto. The specific position and the shape of the component disposing area 103 on the array substrate 1 can be set according to actual situations, which is not limited hereto. Exemplarily, as shown in FIG. 4, the component disposing area 103 is disposed in the middle area of the array substrate 1 and has a circular shape, or, as shown in FIG. 6, the component disposing area 103 is disposed in the edge area of the array substrate 1 and has a rectangular shape. A pixel unit can be understood as a pixel light-emitting component structure, which usually includes a pixel anode, a pixel light-emitting layer, and a pixel cathode. The pixel unit is driven to emit light through a pixel circuit, and the pixel light-emitting layer includes at least one color of light-emitting material.

In one embodiment, the base substrate 10 is used to carry and protect the film layer formed thereon. The drive circuit layer 20 includes a drive circuit for driving the light-emitting element, and the specific implementation of the drive circuit can be set according to actual situations, which is not limited hereto. Exemplarily, the drive circuit may include a "2T1C" drive circuit, a "7T1C" drive circuit, or other drive circuits known that where "T" refers to a thin film transistor, and "C"

refers to a storage capacitor Cst, a gate G of the thin film transistor is disposed on the gate metal layer 21, and one capacitor plate 221 of the storage capacitor Cst is positioned on the first metal layer 22. It should be noted that, in addition to the gate metal layer 21 and the first metal layer 22, the drive circuit layer 20 also includes other film structures, which can be set according to actual conditions. Exemplary descriptions will be given later, which may not be discussed in detail here.

It can be understood that, researches have shown that, the larger area of the capacitor plates, the easier to attract static charges, in the manufacturing process, the closer the capacitor plates are to the boundary of the array substrate, the easier it is to attract static charges. In the first sub-area 104 and the second sub-area 105, along the second direction Y, two adjacent capacitor plates 221 are connected on the first metal layer 22, the capacitor metal blocks formed by interconnected capacitor plates 221 have a larger area (compared to a single capacitor plate) and are easier to attract static charges. Since the first sub-area 104 is closer to the boundary of the array substrate mother board that is easy to accumulate static charges (the boundary of the array substrate mother board extending in the first direction X) than the second sub-area 105, compared with the capacitor metal blocks in the second sub-area 105, the amount of static charges accumulated on the capacitor metal blocks in the first sub-area 104 is greater, the bias voltage applied by the capacitor plate 221 in the first sub-area 104 to the drive transistor below it is inconsistent with that in the second sub-area 105 to the drive transistor below it, resulting in the difference in the characteristic shift of the drive transistors in the first sub-area 104 and the second sub-area 105, and finally causing split-screens in the first sub-area 104 and the second sub-area 105. However, in an embodiment of the present disclosure, with reference to FIG. 4 and FIG. 6, for the first-type array substrate 1P, in the first sub-area 104 and the second sub-area 105, along the second direction Y, any two capacitor plates 221 are not connected on the first metal layer 22, for the first sub-area 104, it includes a small number of capacitor plates 221 which are adjacent to the boundary of the array substrate mother board and a large number of capacitor plates 221 that are not adjacent to the boundary of the array substrate mother board, since there is no difference in whether the capacitor plates 221 are adjacent to the boundary of the array substrate mother board as the capacitor plates 221 in the first sub-area 104 are not adjacent to the boundary of the array substrate mother board and the capacitor plates 221 in the second sub-area 105 are not adjacent to the boundary of the array substrate mother board, they have the same ability to attract static charges. The difference between the static charges accumulated on the capacitor plate 221 in the first sub-area 104 that is not adjacent to the boundary of the array substrate mother board and that in the second sub-area 105 is relatively small, the difference in bias voltage applied to the drive transistors in the corresponding area is small; as the performance of the drive transistors is similar, there may be no major differences, and split-screens may not occur. In addition, although the static charges accumulated on the capacitor plates 221 adjacent to the boundary of the array substrate mother board in the first sub-area 104 is different from the static charges accumulated on the other capacitor plates 221 in the first sub-area 104; however, in case that in the first sub-area 104, along the first direction, the capacitor plates 221 adjacent to the boundary of the array substrate mother board are not connected, due to the small area of the capacitor plates 221, they are not easy to attract static charges by themselves, and the ability to accumulate static charges is weak. Therefore, the amount of static charges accumulated on the capacitor plates adjacent to the boundary of the array substrate mother board is also small; in this case, the difference of the amount of static charges accumulated on the capacitor plates not adjacent to the boundary of the array substrate mother board is relatively small. It can be understood that, the above principle is explained by taking that the first sub-area 104 adjacent to the boundary of the array substrate mother board, and the second sub-area 105 not adjacent to the boundary of the array substrate mother board as an example, as the principles of a case that the first sub-area 104 is not adjacent to the boundary of the array substrate mother board, and the second sub-area 105 is adjacent to the boundary of the array substrate mother board and that both the first sub-area 104 and the second sub-area 105 are adjacent to the boundary of the array substrate mother board are similar, there is no need to be explained here. It should be noted that, in the first sub-area 104 and the second sub-area 105, along the second direction Y, there are many embodiments in which any two capacitor plates 221 are not connected on the first metal layer 22. An exemplary description will be made below, which may not be discussed in detail here.

It can also be understood that, by setting that along the second direction Y any two capacitor plates 221 are not connected on the first metal layer 22, when the first metal layer 22 is prepared, there is no need to arrange coiling for connecting capacitor plates 221 disposed in the second direction Y, which can reduce the difficulty of making the first metal layer 22, and avoid increasing the frame area caused by coiling.

It should be noted that, in the first-type array substrate 1P, it also includes a third sub-area 106 and/or a fourth sub-area 107, in the third sub-area 106 (fourth sub-area 107), it can be disposed that any two capacitor plates 221 are not connected on the first metal layer 22 (as shown in FIG. 4 and FIG. 6), or that along the second direction Y, there are at least two capacitor plates 221 connected on the first metal layer 22, which is not limited hereto. In an embodiment, in the third sub-area 106 (fourth sub-area 107), along the second direction Y, any two capacitor plates 221 are not connected on the first metal layer 22, in this way, on one hand, the number of capacitor metal blocks with a larger area in the third sub-area 106 (fourth sub-area 107) and that are adjacent to the boundary extending along the first direction X in the array substrate mother board can be reduced, and the amount of static charges accumulated in the third sub-area 106 (fourth sub-area 107) can be reduced, to reduce the difference in the amount of static charges accumulated on the capacitor plates 221 in each area of the same array substrate 1, and to avoid split-screens of the third sub-area 106 (fourth sub-area 107) and the first sub-area 104 and the second sub-area 105; on the other hand, the similarity of the third sub-area 106 (fourth sub-area 107), the first sub-area 104 and the second sub-area 105 can be improved, the higher degree of the similarity, the smaller difficulty of mass production and process of the array substrate 1.

It should also be noted that, in case that the array substrate mother board also includes a second-type array substrate 1Q and a third-type array substrate 1R (as shown in FIG. 3), where the second-type array substrate 1Q is adjacent to the boundary extending along the second direction Y in the array substrate mother board, and the third-type array substrate 1R is not adjacent to the boundary extending in the first direction X and the boundary extending in the second direction Y in the array substrate mother board. Among the second-type array substrate 1Q and the third-type array substrate 1R, along the second direction Y, two sides of the component disposing area 103 include a first sub-area 104 and a second sub-area 105, the first sub-area 104 and the second sub-area 105 each include capacitor plates 221, in the first sub-area 104 and the second sub-area 105 of the second-type array substrate 1Q and the third-type array substrate 1R, it can be disposed that along the second direction Y, any two capacitor plates 221 are not connected on the first metal layer 22 (as shown in FIG. 4 and FIG. 6); it can also be disposed that along the second direction Y, there are at least two capacitor plates 221 connected on the first metal layer 22, which is not limited hereto. In an embodiment, in the second-type array substrate 1Q and the third-type array substrate 1R, along the second direction Y, it can be disposed that any two capacitor plates 221 are not connected on the first metal layer 22, or that at least two capacitor plates 221 are connected on the first metal layer 22, which is not limited hereto. It can be understood that, in the second-type array substrate 1Q and the third-type array substrate 1R, along the second direction Y, in case that any two capacitor plates 221 are not connected on the first metal layer 22, the similarity of the first-type array substrate 1P, the second-type array substrate 1Q, and the third-type array substrate 1R can be increased, and the higher similarity, the smaller difficulty of mass production and process of the array substrate 1.

It should be noted that, the second-type array substrate 1Q is adjacent to the boundary extending along the second direction Y in the array substrate mother board means that, the second-type array substrate 1Q includes a boundary adjacent to the border extending in the second direction Y in the array substrate mother board, or there is a distance between the second-type array substrate 1Q and the boundary extending along the second direction Y in the array substrate mother board, and that other types of array substrates are not included. The third-type array substrate 1R is neither adjacent to the boundary extending in the first direction X nor to the boundary extending in the second direction Y in the array substrate mother board, which means that, there is at least one other type of array substrate spaced between the third-type array substrate 1R and any boundary of the array substrate mother board.

In the array substrate mother board provided by the embodiment of the present disclosure, the first sub-area 104 and the second sub-area 105 on two sides of the component disposing area 103 include capacitor plates 221, and along the second direction Y, any two capacitor plates 221 are not connected on the first metal layer 22, thus, on the first metal layer 22, there will be no capacitor metal blocks with a large area formed by connecting the capacitor plates 221 arranged along the second direction Y to each other in the first sub-area 104 and the second sub-area 105; in other words, there does not exist the capacitor metal blocks that are easy to accumulate static charges and those are adjacent to the boundary extending in the first direction X of the array substrate mother board in the first sub-area 104 and the second sub-area 105 (or there is a small number), in this case, the amount of static charges accumulated on the capacitor plate 221 in the first sub-area 104 and the second sub-area 105 can be reduced; meanwhile, the difference in the amount of static charges accumulated on the capacitor plate 221 in the first sub-area 104 and the second sub-area 105 can be reduced, split-screens caused by the large difference in the amount of static charges accumulated on the capacitor plate 221 in the first sub-area 104 and the second sub-area 105 can be solved, and to improve display effect.

Figure 7:
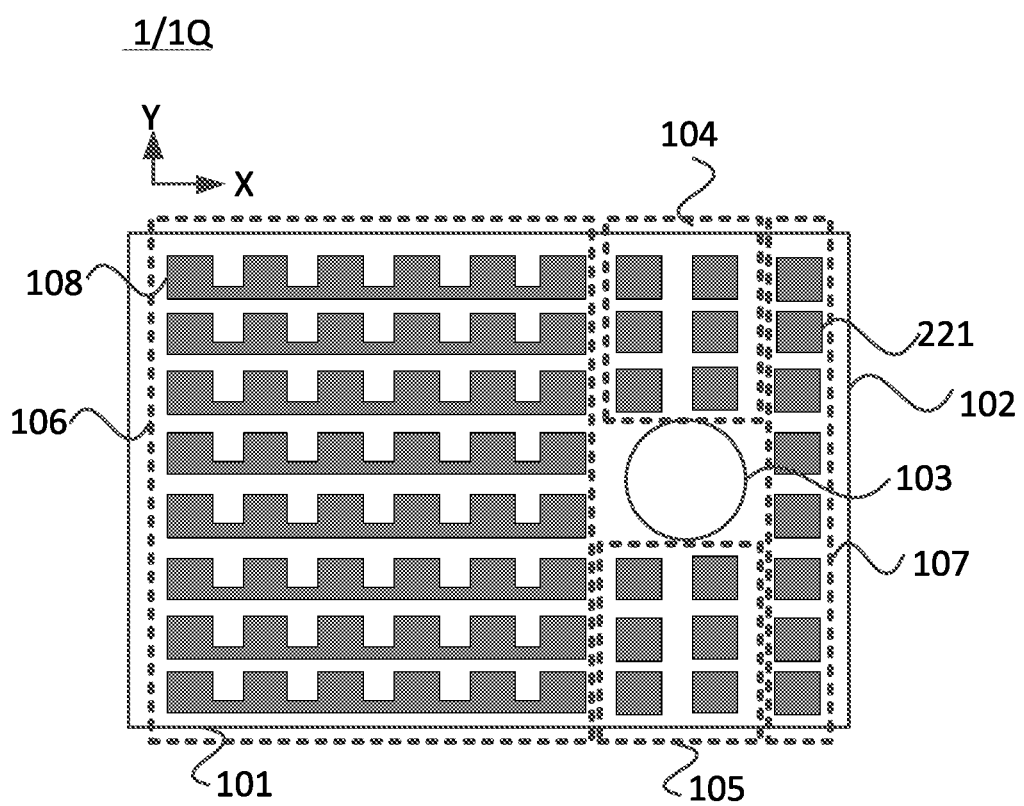
FIG. 7 is a schematic structure view of a second-type array substrate in FIG. 3.

FIG. 7 is a schematic structure view of the second-type array substrate in FIG. 3. With reference to FIG. 4, FIG. 6, and FIG. 7, in an embodiment, the plurality of array substrates 1 includes second-type array substrates 1Q, and the plurality of second-type array substrates 1Q are arranged along the second direction Y, and are adjacent to the boundary of the array substrate mother board extending in the second direction Y, in the second-type array substrate 1Q, along the first direction X, two sides of the component disposing area 103 include a third sub-area 106 and a fourth sub-area 107, the third sub-area 106 and the fourth sub-area 107 include capacitor plates 221, and along the first direction X, any two capacitor plates 221 are not connected on the first metal layer 22 (as shown in FIG. 4 and FIG. 6); or, along the first direction X, there are at least two capacitor plates 221 connected on the first metal layer 22 (as shown in FIG. 7).

In one embodiment, in the third sub-area 106 and the fourth sub-area 107, along the first direction X, in a case that two capacitor plates 221 are connected on the first metal layer 22, in an embodiment, the length of the boundary of the array substrate mother board in the first direction X is greater than that in the second direction Y. Researches have shown that the array substrate mother board is easier to accumulate static charges on the long side. Although the short side can also accumulate static charges, the amount of static charges accumulated on the short side is usually less than that accumulated on the long side; in this case, when the length of the boundary of the array substrate mother board in the first direction X is greater than that in the second direction Y, though in the third sub-area 106 and the fourth sub-area 107, along the first direction X, there are at least two capacitor plates 221 connected on the first metal layer 22, the static charges accumulated on the capacitor metal blocks 108 formed by connecting capacitor electrodes disposed in the first direction X to each other is also relatively small, the difference in the amount of static charges accumulated on the capacitor plate 221 in the third sub-area 106 and the fourth sub-area 107 is small, thus it is not easy for human eyes to distinguish the display difference between the third sub-area 106 and the fourth sub-area 107, which does not affect user's viewing.

In an embodiment, in the third sub-area 106 and the fourth sub-area 107, along the first direction X, any two capacitor plates 221 are not connected on the first metal layer 22, capacitor metal blocks 108 with a large area by connecting the capacitor plates 221 arranged along the first direction X to each other may not form in the third sub-area 106 and the fourth sub-area 107; thus, the number of capacitor metal blocks 108 with a larger area in the third sub-area 106 and those are adjacent to the boundary extending along the second direction Y in the array substrate mother board can be reduced, the amount of static charges accumulated in the third sub-area 106 and the fourth sub-area 107 can be reduced; meanwhile, the difference in the amount of static charges accumulated on the capacitor plates 221 in the third sub-area 106 and the fourth sub-area 107 is reduced to avoid split-screens in the third sub-area 106 and the fourth sub-area 107.

It should be noted that, in the third sub-area 106 and the fourth sub-area 107, along the second direction Y, it can be disposed that any two capacitor plates 221 are not connected on the first metal layer 22, or there can be at least two capacitor plate 221 connected on the first metal layer 22, which is not limited hereto.

It should also be noted that, the third sub-area 106 and the fourth sub-area 107 of the first-type array substrate 1P and the third-type array substrate 1R, it can be disposed that along the first direction X, any two capacitor plates 221 are not connected on the first metal layer 22 (as shown in FIG.

4 and FIG. 6); it can also be disposed that along the first direction X, there are at least two capacitor plates 221 connected on the first metal layer 22, which is not limited hereto. In an embodiment, in the first-type array substrate 1P and the third-type array substrate 1R, along the first direction X, it can be disposed that any two capacitor plates 221 are not connected on the first metal layer 22, or there are at least two capacitor plate 221 connected on the first metal layer 22, which is not limited hereto. It can be understood that, in the second-type array substrate 1Q and the third-type array substrate 1R, along the second direction Y, in case that any two capacitor plates 221 are not connected on the first metal layer 22, the similarity of the first-type array substrate 1P, the second-type array substrate 1Q, and the third-type array substrate 1R can be increased, and the higher similarity, the smaller difficulty of mass production and process of the array substrate 1.

Also with reference to FIG. 4 and FIG. 6, in an embodiment, in any array substrate 1, among the plurality of capacitor plates 221 respectively disposed on two sides of the component disposing area 103 along the second direction Y, any two capacitor plates 221 are not connected in the first plane where the metal layer 22 is located.

It can be understood that, by disposing any two capacitor plates 221 to be disconnected on the plane where the first metal layer 22 is located, the capacitor plates 221 on the first metal layer 22 can be made independent of each other, that is, on the first metal layer 22, along the second direction Y, capacitor plates 221 are spaced apart from each other, and capacitor metal blocks with a large area may not form. Since the area of the capacitor plates 221 is small, the capacity of the capacitor plate 221 to accumulate static charges is weak, thus, the amount of static charges accumulated on each capacitor plate 221 is small, and the difference in the amount of static charges accumulated on any two capacitor plates 221 is small, therefore, the capacitor plates 221 in each position of the array substrate 1 have less and relatively uniform influence on the drive transistors located thereunder, split-screens may not occur, and to improve display effect. In addition, with the same disposition of the first metal layer 22 in each array substrate 1, the difficulty of making the first metal layer 22 can be reduced, and improving efficiency and reducing costs.

The embodiments of the present disclosure also provide an array substrate. With reference to FIG. 4 to FIG. 7, the array substrate 1 includes: a first boundary 101 extending in the first direction X and a second boundary 102 extending in the second direction Y, where the first direction X intersects the second direction Y; the array substrate 1 includes a component disposing area 103; the array substrate 1 further includes a base substrate 10 and a drive circuit layer 20, the drive circuit layer 20 includes a gate metal layer 21 and a first metal layer 22, the first metal layer 22 is disposed on a side of the gate metal layer 21 facing away from the base substrate 10; the first metal layer 22 includes capacitor plates 221 disposed in an array along the first direction X and the second direction Y; in the array substrate 1, along the second direction Y, two sides of the component disposing area 103 include a first sub-area 104 and a second sub-area 105, the first sub-area 104 and the second sub-area 105 include capacitor plates 221, and along the second direction Y, any two capacitor plates 221 are not connected on the first metal layer 22.

In one embodiment, the array substrate 1 can be obtained by cutting any of the above-mentioned array substrate mother boards, that is, separating the first-type array substrate 1P, the second-type array substrate 1Q, or the third-type array substrate from the array substrate mother plate, which is not limited hereto. The specific descriptions of the array substrate 1 can refer to the previous discussion, which may not be discussed in detail here.

In the array substrate 1 provided by the embodiment of the present disclosure, the first sub-area 104 and the second sub-area 105 on two sides of the component disposing area 103 include capacitor plates 221, along the second direction Y, any two capacitor plates 221 are not connected on the first metal layer 22, thus, on the first metal layer 22, no large-area capacitor metal blocks may not form by connecting the capacitor plates 221 arranged along the second direction Y to each other in the first sub-area 104 and the second sub-area 105; in other words, there do not exist capacitor metal blocks that are easy to accumulate static charges and that are adjacent to the boundary extending in the first direction X of the array substrate mother board in the first sub-area 104 and the second sub-area 105 (or there are a small number), in this way, the amount of static charges accumulated on the capacitor plates 221 in the first sub-area 104 and the second sub-area 105 can be reduced, meanwhile, the difference in the amount of static charges accumulated on the capacitor plate 221 in the first sub-area 104 and the second sub-area 105 can be reduced, and to improve split-screens caused by the large difference in the amount of static charges accumulated on the capacitor plate 221 in the first sub-area 104 and the second sub-area 105 and improve display effect.

Also with reference to FIG. 4, FIG. 6 and FIG. 7, in an embodiment, in the array substrate 1, any two capacitor plates 221 arranged along the second direction Y are not connected on the plane where the first metal layer 22 is located.

It can be understood that, in case that the array substrate 1 is obtained by separating the first-type array substrate 1P from the array substrate mother board, any two capacitor plates 221 disposed in the second direction Y are not connected on the plane where the first metal layer 22 is located, so that capacitor metal blocks formed by connecting the capacitor plates 221 along the second direction Y to each other with a larger area and those are adjacent to the boundary of the array substrate mother board may not occur in the third sub-area 106 (fourth sub-area 107), in this way, split-screens caused by the excessive difference in the amount of static charges accumulated on the capacitor plate 221 in the first sub-area 104, the second sub-area 105, and the third sub-area 106 (the fourth sub-area 107) can be avoided.

It can also be understood that, whether the array substrate 1 is obtained by separating the first-type array substrate 1P, the second-type array substrate 1Q, or the third-type array substrate 1R from the array substrate mother board, by disposing any two capacitor plates 221 along the second direction Y to be not connected on the plane where the first metal layer 22 is located, the difficulty of making the first metal layer 22 can be reduced, and improving efficiency and reducing costs.

In one embodiment, there are many embodiments as to "any two capacitor plates 221 arranged along the second direction Y are not connected on the plane where the first metal layer 22 is located", which are not limitations of the present disclosure.

In an embodiment, any two capacitor plates 221 arranged along the second direction Y are insulated. In one embodiment, any two capacitor plates 221 arranged along the second direction Y are disconnected on the plane where the first metal layer 22 is located, the two capacitor plates 221 disposed in the second direction Y are not connected through the connection structure in other film layers, where the connection structure here refers to a structure directly contacting and connecting with the capacitor plates 221, the connection capacitor plates 221 arranged along the second direction Y can be connected through the connection structure, and it is only used to connect the connection capacitor plates 221 arranged along the second direction Y with no other functions. In this way, there is no need to provide a connection structure for connecting two capacitor plates 221 arranged along the second direction Y in other film layers, and there is no need to modify the design of other film layers or there may be little modification, so that the difficulty of film layer design of the array substrate 1 can be reduced.

Figure 8:
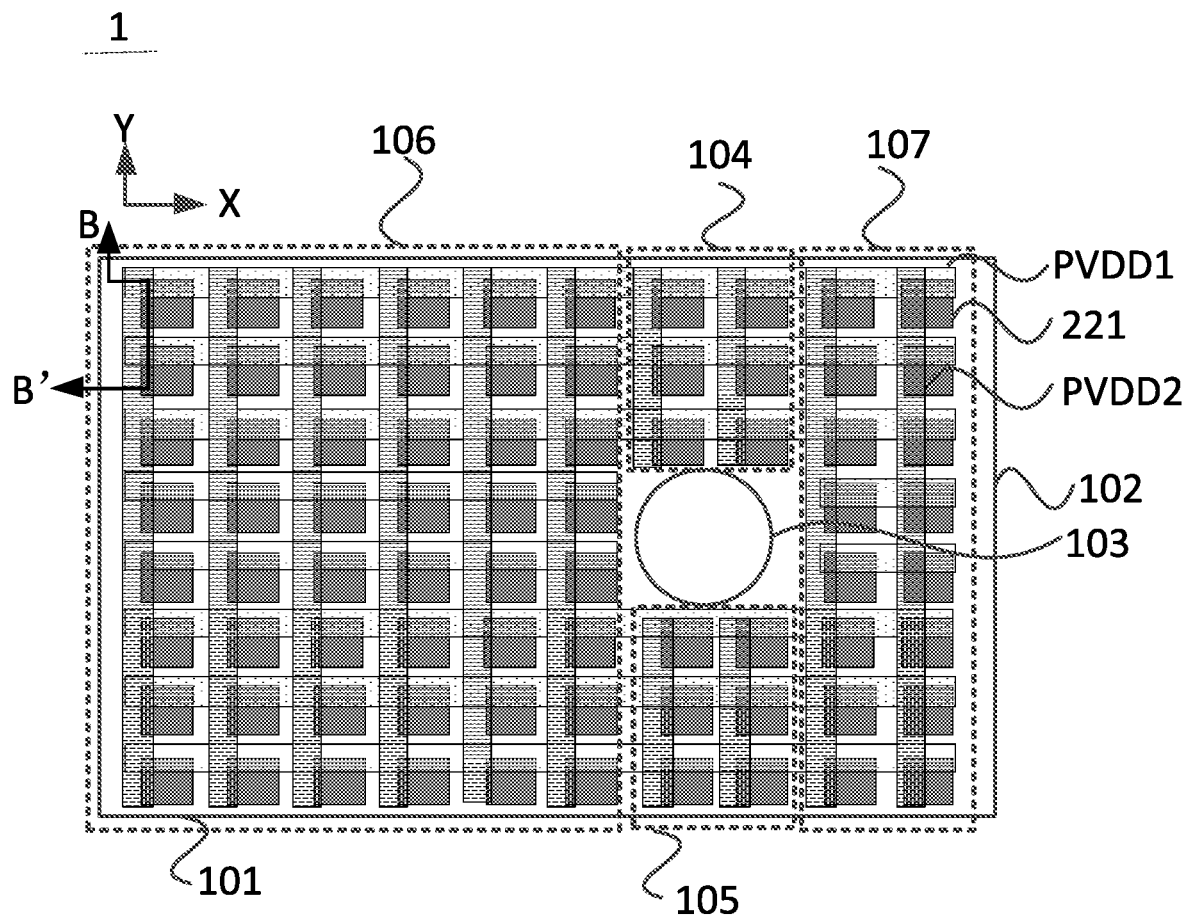
FIG. 8 is a schematic structure view of an array substrate provided by an embodiment of the present disclosure.
Figure 9:
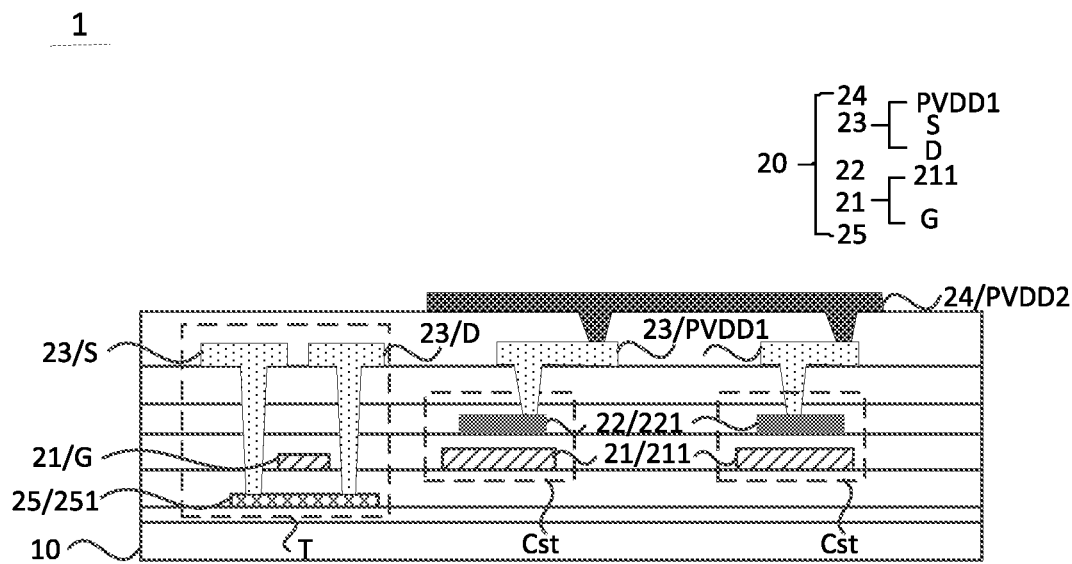
FIG. 9 is a cross-sectional view along the BB' direction of FIG. 8.

FIG. 8 is a schematic structure view of an array substrate provided by an embodiment of the present disclosure. FIG. 9 is a cross-sectional view along the BB' direction of FIG. 8. With reference to FIG. 8 and FIG. 9, in an embodiment, along the first direction X and the second direction Y, on the first metal layer 22, any two capacitor plates 221 are insulated.

It can also be understood that, whether the array substrate 1 is obtained by separating the first-type array substrate 1P, the second-type array substrate 1Q, or the third-type array substrate 1R from the array substrate mother board, by disposing along the first direction X and the second direction Y, on the first metal layer 22, any two capacitor plates 221 are insulated, in each area of the first metal layer 22, no large-area capacitor metal blocks may be formed by capacitor plates 221 connected to each other. In other words, capacitor plates 221 are independent of each other, and as capacitor plates 221 with a smaller area are not easy to accumulate static charges, in this way, the amount of static charges accumulated on the capacitor plates 221 during the manufacturing process of the array substrate can be reduced, and reducing the impact of static charge accumulation on the drive transistor, which can also reduce the difference in the amount of static charges on capacitor plates 221, improve display uniformity and solve the problem of split-screens.

Also with reference to FIG. 8 and FIG. 9, in an embodiment, the drive circuit layer 20 further includes a second metal layer 23 located on a side of the first metal layer 22 facing away from the base substrate 10, and a third metal layer 24 located on a side of the second metal layer 23 facing away from the base substrate 10; the second metal layer 23 includes a first power signal lines PVDD1, and the first power signal line PVDD1 extends along the first direction X, and the plurality of first power signal lines PVDD1 are arranged along the second direction Y; the third metal layer 24 includes second power signal lines PVDD2, the second power signal line PVDD2 extends along the second direction Y, and the plurality of second power signal lines PVDD2 are arranged along the first direction X; the first power supply signal line PVDD1 and the second power supply signal line PVDD2 are connected to the same power supply voltage signal input terminal.

In one embodiment, the first power signal line PVDD1 and the second power signal line PVDD2 can be used to transmit power signals to the drive circuit. At this time, the first power signal line PVDD1 can be connected to the capacitor plate 221 through a via hole; the second power signal line PVDD2 can be connected to the capacitor plate 221 through a via hole, or be connected to the first power signal line PVDD1 through a via hole (as shown in FIG. 8).

It can be understood that, since the second metal layer 23 is located on the side of the first metal layer 22 facing away from the base substrate 10, in the preparation of the array substrate 1, the processes of the first metal layer 22 are earlier than those of the second metal layer 23. After the preparation of the first metal layer 22 is completed, although capacitor plates 221 are in a suspended state, static charges will be accumulated on them, capacitor plates 221 that are independent from each other are not easy to accumulate static charges due to small area and small differences in the accumulated static charges between the capacitor plates 221, no split-screen may occur. After the preparation of the second metal layer 23 or the third metal layer 24 is completed, the capacitor plates 221 are no longer in a floated state, instead, they are connected to the power supply voltage signal input terminal to form electrostatic discharge channels, the static charges accumulated on the capacitor plates 221 can be exported to avoid split-screens.

It can also be understood that, by disposing the first power signal line PVDD1 and the second power signal line PVDD2 to cross to form a grid shape, the signal lines used for transmitting the power signal can be more evenly distributed in the array substrate 1, which can realize uniformity of the power supply signal, reduce the voltage drop of the power signal line, and improve display effect.

It should be noted that, FIG. 8 only exemplarily shows another capacitor plate 211 provided with a gate G and a storage capacitor Cst on the gate metal layer 21, a capacitor plate 221 is provided on the first metal layer 22, a first power signal line PVDD1, a source electrode S, and a drain electrode D are provided at the second metal layer 23, and a second power signal line PVDD2 is provided at the third metal layer 24, which is not limited hereto, and can be set the structure included in each metal layer according to actual situations. Exemplarily, a gate scan line may also be provided on the gate metal layer 21, an initialization signal line may also be provided on the gate metal layer 21, the first metal layer 22, the second metal layer 23, or the third metal layer 24, a data signal line DATA may also be provided at the second metal layer 23. The gate scan line is used to transmit a scan signal to the drive circuit, so that the drive circuit controls the light-emitting element to emit light in response to the scan signal; the data signal line is used to transmit a data voltage signal to the drive circuit, so that the drive circuit generates a drive current based on the data voltage signal; the initialization signal line is used to transmit an initialization voltage signal to the drive circuit, so that the voltage of the node that needs to be initialized in the driving circuit becomes the voltage value of the initialization voltage signal.

Figure 10:
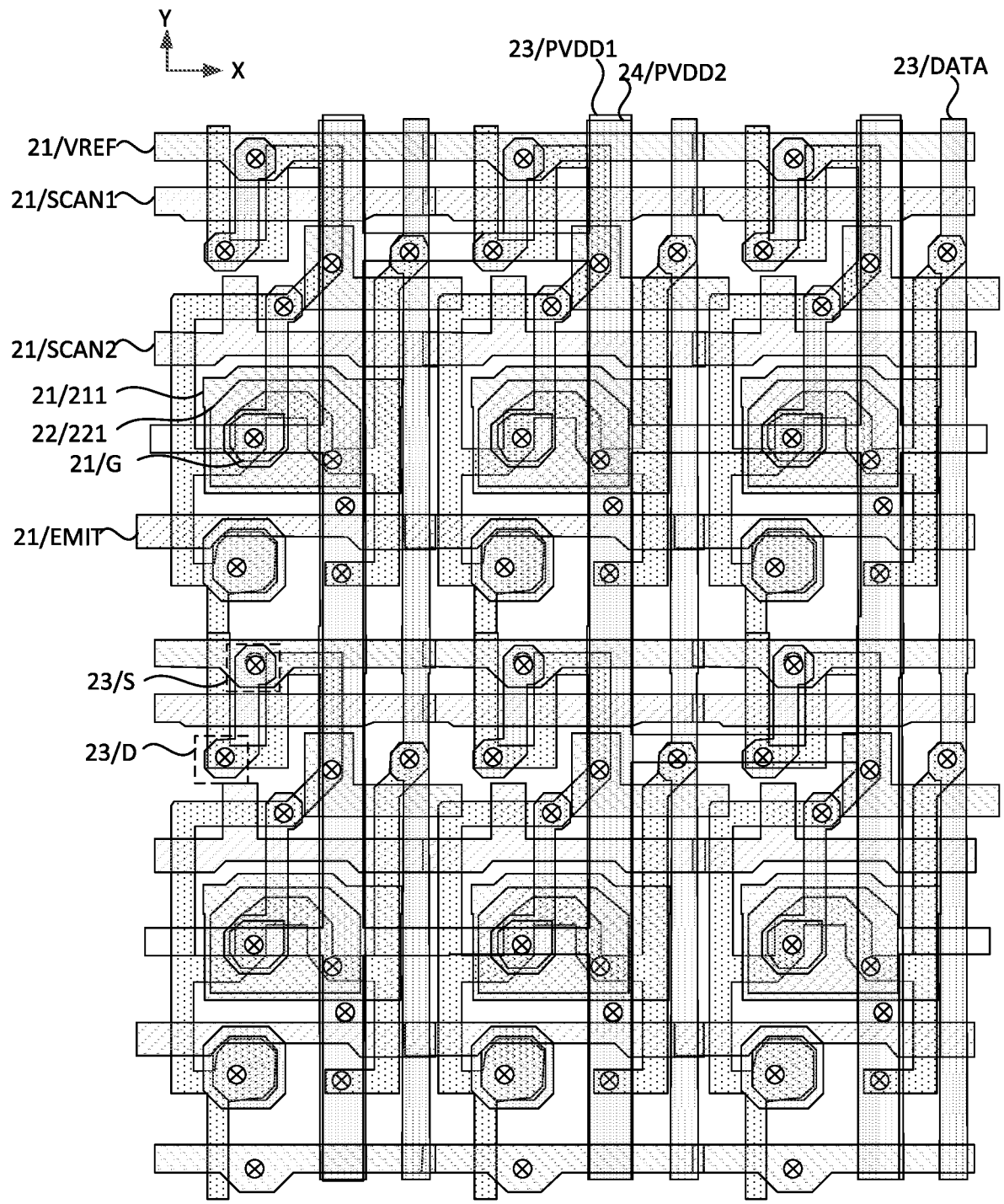
FIG. 10 is a layout view of an array substrate provided by an embodiment of the present disclosure.

It should also be noted that, the specific layout of each metal film layer in the array substrate 1 can be set according to actual situations, which is not limited hereto. Exemplarily, FIG. 10 is a layout view of an array substrate provided by an embodiment of the present disclosure. With reference to FIG. 10, the gate metal layer 21 is provided with a gate G, another capacitor plate 211 of the storage capacitor Cst, a gate scan line, and an initialization signal line VREF, where the gate scan line includes a first scan signal line SCAN1, a second scan signal line SCAN1 and a light emission control scan signal line EMIT, the first metal layer 22 is provided with a capacitor plate 221, the second metal layer 23 is provided with a first power signal line PVDD1, a source electrode S, a drain electrode D, and a data signal line DATA, and the third metal layer 24 is provided with a second power supply signal line PVDD2. In an embodiment, the second power supply signal line PVDD2 at the third metal layer 24 can be disposed to at least partially cover the gate node of the drive transistor, which plays the role of signal shielding, to avoid signal jump of other signal lines in the pixel circuit having influence on the gate potential of the drive transistor, and to improve the stability of the pixel circuit. In addition, as the number of laminated metal film layers in the area where the gate node of the drive transistor is located has been relatively large, light transmittance is low, the portion of the second power signal line PVDD2 extending in the first direction X above the gate node may not affect light transmittance of the area, compared with the portion of the second power signal line PVDD2 extending along the first direction X in other areas with higher light transmittance, which may have an impact on light transmittance, such arrangement can improve the overall light transmittance of the array substrate.

Figure 11:
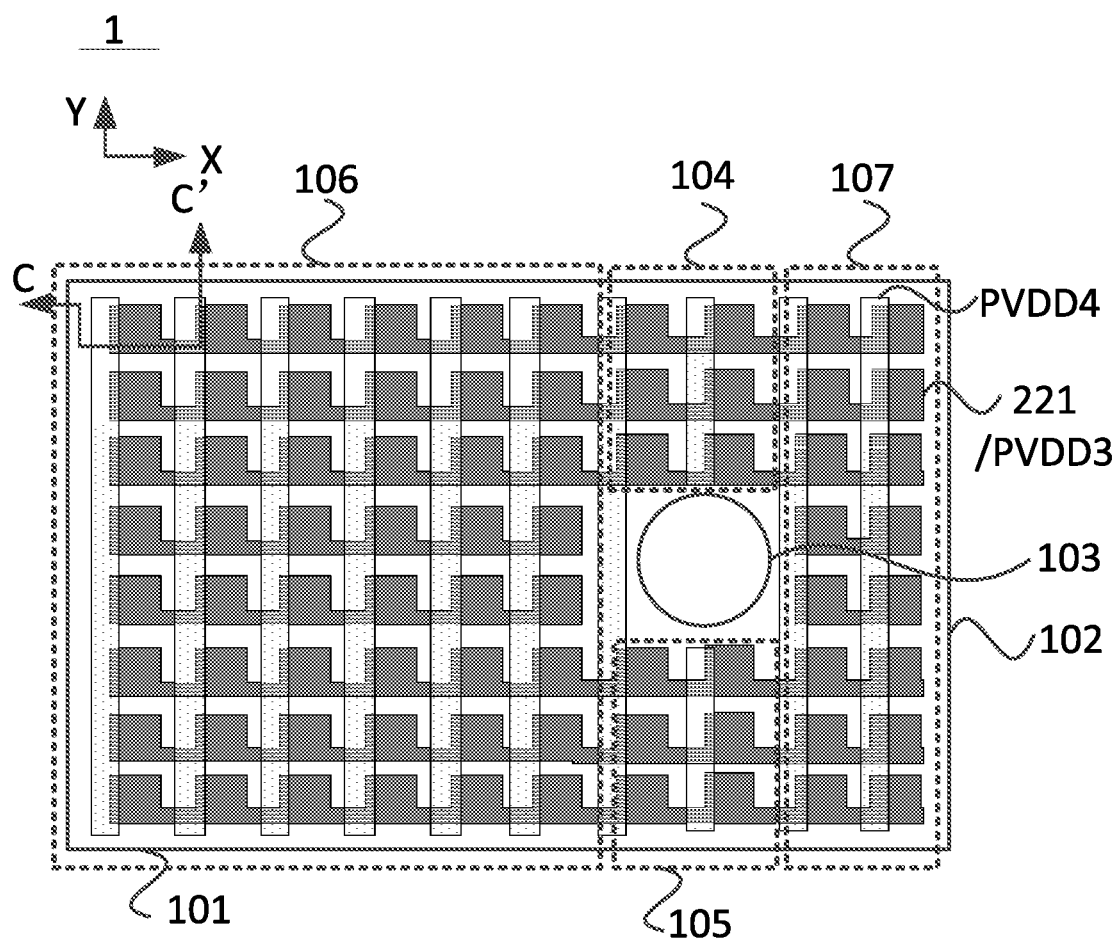
FIG. 11 is a schematic structure view of another array substrate provided by an embodiment of the present disclosure.
Figure 12:
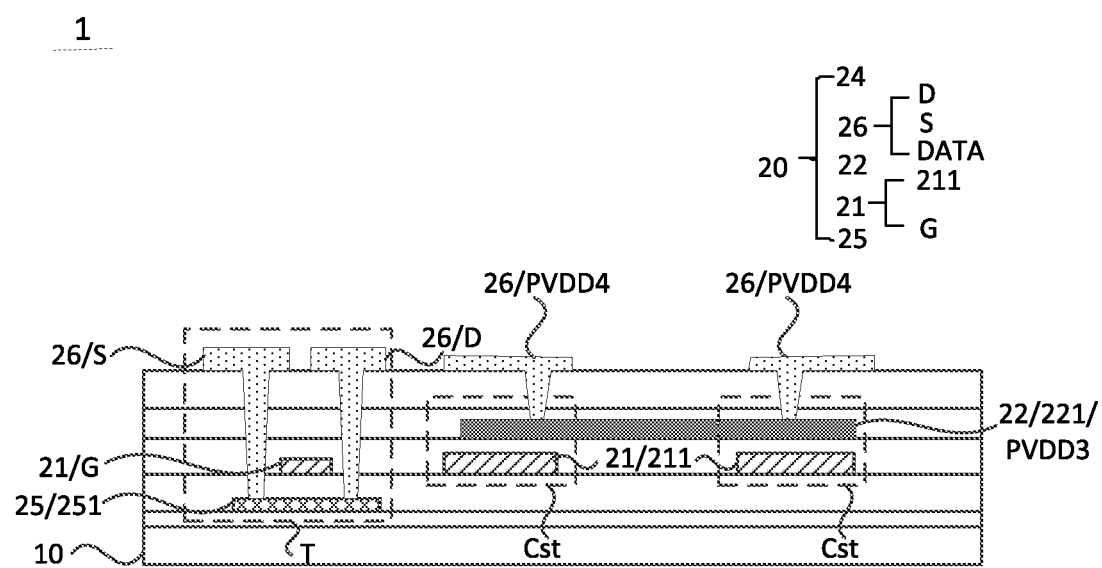
FIG. 12 is a cross-sectional view along the CC' direction of FIG. 11.

FIG. 11 is a schematic structure view of another array substrate provided by an embodiment of the present disclosure. FIG. 12 is a cross-sectional view along the CC' direction of FIG. 11. With reference to FIG. 11 and FIG. 12, in an embodiment, two adjacent capacitor plates 221 arranged along the first direction X are electrically connected.

It can also be understood that, whether the array substrate 1 is obtained by separating the first-type array substrate 1P, the second-type array substrate 1Q, or the third-type array substrate 1R from the array substrate mother board, two adjacent capacitor plates 221 arranged along the first direction X are disposed to be electrically connected, although the capacitor plates 221 arranged along the first direction X are connected to each other to form capacitor metal blocks with a larger area, in the formed capacitor metal block, at most two metal electrode blocks are adjacent to the boundary of the array substrate mother board extending along the first direction X, while other capacitor metal blocks are not adjacent to the boundary of the array substrate mother board extending along the first direction X, therefore, a large amount of static charges will not be accumulated, even if static charges is accumulated, due to the small difference, split-screen may not occur in the first sub-area 104 and the second sub-area 105. It can also be understood that, in the first sub-area 104 (the second sub-area 105), although there is a difference in the number between the capacitor metal blocks adjacent to the boundary of the array substrate mother board extending in the first direction X and the static charges accumulated on other capacitor metal blocks, which may cause display differences, the number of pixel units corresponding to the capacitor metal blocks adjacent to the boundary of the array substrate mother board extending in the first direction X is small, so that split-screens may not be easily observed by human eyes.

In an embodiment, the capacitor plates 221 adjacent to the first boundary 101 can also be disposed as virtual capacitor plates 221, along the direction perpendicular to the plane where the array substrate is located, the virtual capacitor plates 221 do not overlap with the channels of the thin film transistor.

Also with reference to FIG. 11 and FIG. 12, in an embodiment, the drive circuit layer 20 further includes a fourth metal layer 26 located on the side of the first metal layer 22 facing away from the base substrate 10; the plurality of capacitor plates 221 arranged along the first direction X and those are electrically connected to each other are multiplexed into the third power signal line PVDD3, and the plurality of third power signal lines PVDD3 are arranged along the second direction Y; the fourth metal layer 26 includes fourth power signal lines PVDD4, the fourth power signal line PVDD4 extends along the second direction Y, and the plurality of fourth power signal lines PVDD4 are arranged along the first direction X; the third power supply signal line PVDD3 and the fourth power supply signal line PVDD4 are connected to the same power supply voltage signal input terminal.

In one embodiment, the third power signal line PVDD3 and the fourth power signal line PVDD4 can be used to transmit power signals to the drive circuit. At this time, the third power signal line PVDD3 can be connected to the fourth power signal line PVDD4 through a via hole.

It can be understood that, since the fourth metal layer 26 is located on the side of the first metal layer 22 facing away from the base substrate 10, in the preparation of the array substrate 1, the processes of the first metal layer 22 are earlier than those of the fourth metal layer 26. After the preparation of the first metal layer 22 is completed, although the third power signal line PVDD3 (the plurality of capacitor plates 221 electrically connected to each other) is in a floated state, split-screens may not occur in the first sub-area 104 and the second sub-area 105. The principle can refer to previous discussions, and there is no need to be explained here. After the preparation of the second metal layer 23 is completed, the third power signal line PVDD3 is connected to the fourth power signal line PVDD3, which is no longer in a suspended state, the static charges accumulated on the third power signal line PVDD3 can be exported through the fourth power signal line PVDD4, thus, split-screens may not occur.

It can also be understood that, by disposing the third power signal line PVDD3 and the fourth power signal line PVDD4 to cross to form a grid shape, the signal lines used for transmitting the power signal can be more evenly distributed in the array substrate 1, which can realize the uniformity of the power supply signal, and reduce the voltage drop of the power signal line.

It should be noted that, FIG. 11 only exemplarily shows another capacitor plate 211 provided with a gate G and a storage capacitor Cst on the gate metal layer 21, the first metal layer 22 is provided with a capacitor plate 221 (the third power signal line PVDD3), the second metal layer 23 is provided with the fourth power signal line PVDD4, a source electrode S and a drain electrode D, which it is not limited hereto, it can be set the structure included in each metal layer according to actual situations, exemplarily, a gate scan line and an initialization signal line VREF may be further provided on the gate metal layer 21, and a data signal line DATA may be further provided at the second metal layer 23.

Figure 13:
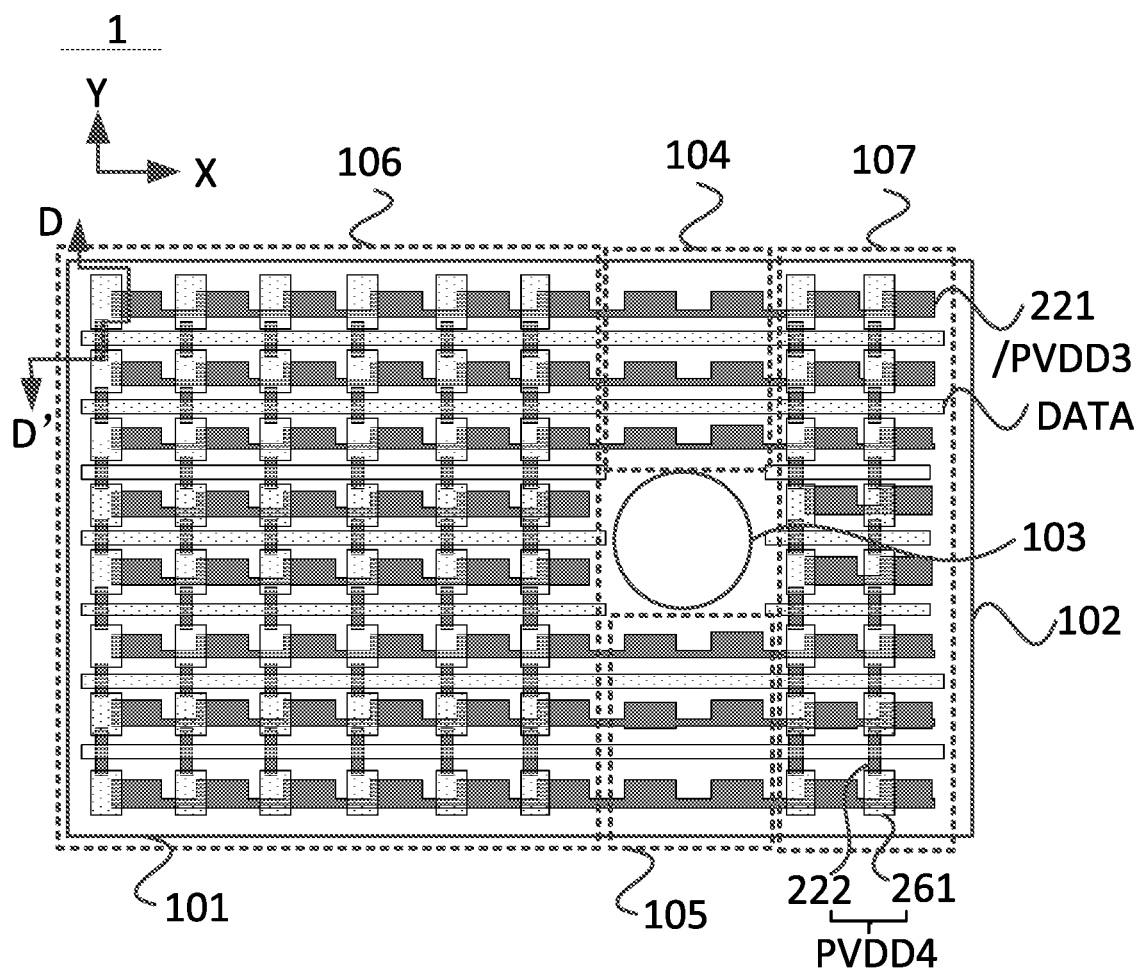
FIG. 13 is a schematic structure view of another array substrate provided by an embodiment of the present disclosure.
Figure 14:
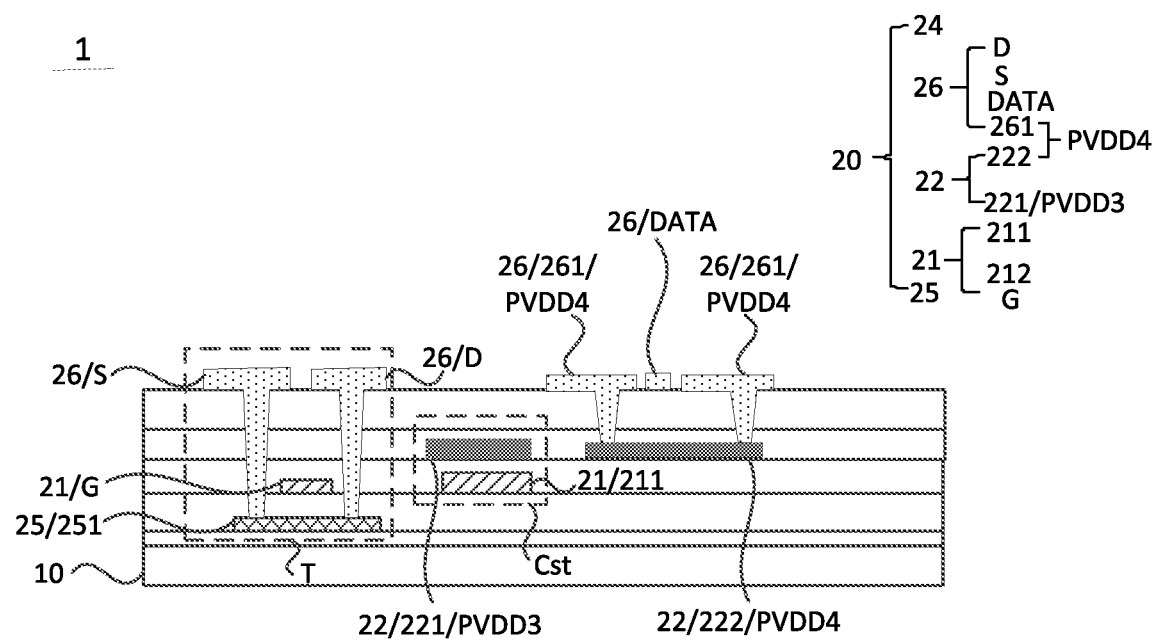
FIG. 14 is a cross-sectional view along the DD' direction of FIG. 13.
Figure 15:
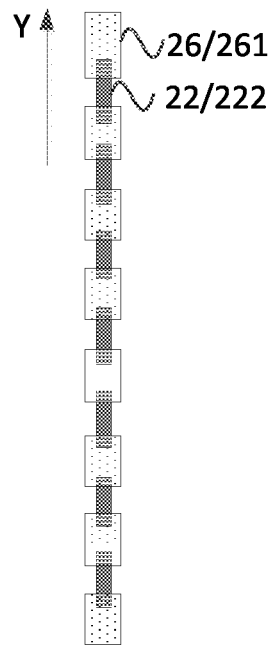
FIG. 15 is a schematic structure view of a fourth power signal line in FIG. 13.

FIG. 13 is a schematic structure view of another array substrate provided by an embodiment of the present disclosure. FIG. 14 is a cross-sectional view along the DD' direction of FIG. 13. FIG. 15 is a schematic structure view of the fourth power signal line in FIG. 13. With reference to FIG. 13 to FIG. 15, in an embodiment, the fourth power signal line PVDD4 includes a wiring portion 261 and a first connection portion 222. The wiring portion 261 is disposed on the fourth metal layer 26, and the first connection portion 222 is disposed on the first metal layer; the wiring portion 261 extends along the second direction Y, and two adjacent wiring portions 261 along the second direction Y are electrically connected by the first connecting portion 222.

It can be understood that, in the display panel provided by the related art, the data signal line DATA extending along the first direction X is usually provided in the fourth metal layer 26, in order to prevent the data signal line DATA and the fourth power signal line PVDD4 from being crossed and leading to short circuit, the fourth power signal line PVDD4 can be disposed to include a wiring portion 261 and a first connecting portion 222, where the wiring portion 261 on the fourth metal layer 26 does not overlap with the data signal line DATA, and the two adjacent wiring portions 261 along the second direction Y are electrically connected by the first connecting portion 222.

Figure 16:
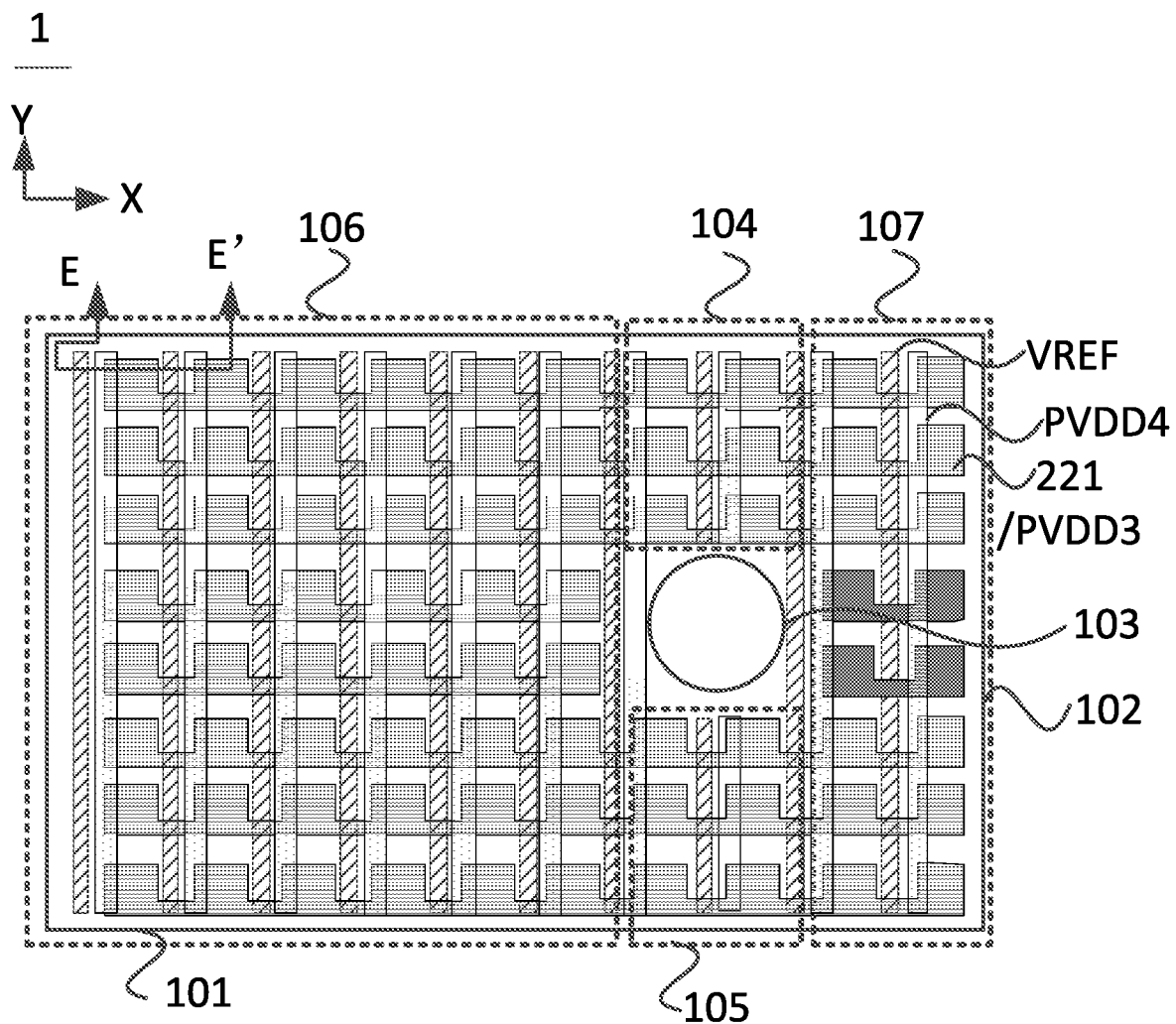
FIG. 16 is a schematic structure view of another array substrate provided by an embodiment of the present disclosure.
Figure 17:
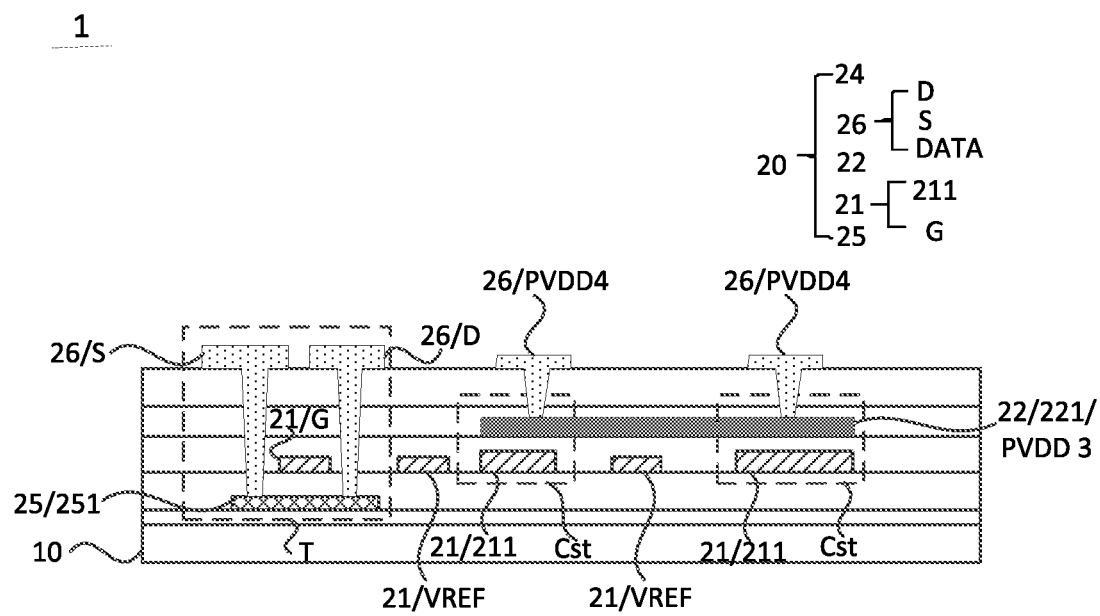
FIG. 17 is a cross-sectional view along the EE' direction of FIG. 16.

FIG. 16 is a schematic structure view of another array substrate provided by an embodiment of the present disclosure. FIG. 17 is a cross-sectional view along the EE' direction of FIG. 16. With reference to FIG. 16 and FIG. 17, in an embodiment, the drive circuit layer 20 further includes an initialization signal line VREF, the initialization signal line VREF extends along the second direction Y, and initialization signal lines VREF are arranged along the first direction X; the initialization signal line VREF is positioned on the gate metal layer 21.

In one embodiment, the initialization signal line VREF is electrically connected to a node that needs to be initialized in the drive circuit, which is used to transmit an initialization voltage signal to the drive circuit, so that the voltage of the node that needs to be initialized in the drive circuit becomes the voltage value of the initialization voltage signal.

It can be understood that, in the display panel provided by the related art, the initialization signal line VREF extending along the second direction Y is usually disposed on the first metal layer 22; while in another embodiment of the present disclosure, the third power signal line PVDD3 disposed on the first metal layer 22 extends along the first direction X, the initialization signal line VREF is disposed on the gate metal layer 21, which can prevent the initialization signal line VREF and the third power signal line PVDD3 from being crossed and leading to short circuit. It can also be understood that, the initialization signal line VREF is moved to the gate metal layer 21, so that the first metal layer 22 does not need to reserve a position for the initialization signal line VREF, the area of the capacitor plate 221 can be enlarged to occupy the position originally reserved for the initialization signal line VREF. In this way, the area of the capacitor plate 221 can be increased, and, the storage capacity of the storage capacitor Cst formed by the capacitor plate 221 is increased, meanwhile, the capacitor plate 221 with larger area can play a better signal-shielding role and prevent interference.

It should be noted that, FIG. 16 only exemplarily shows that a gate G, another capacitor plate 211 of the storage capacitor Cst, and an initialization signal line VREF are disposed on the gate metal layer 21; the first metal layer 22 is provided with a capacitor plate 221 (the third power signal line PVDD3), and the fourth metal layer 26 is provided with a fourth power signal line PVDD4, a source electrode S and a drain electrode D, which is not limited hereto, it can be set the structure included in each metal layer according to actual situations; exemplarily, a gate scan line may be provided on the gate metal layer 21, and a data signal line DATA may be provided at the fourth metal layer 26.

In an embodiment, the drive circuit layer 20 further includes a connecting metal layer located between the base substrate 10 and the first metal layer 22, and the connecting metal layer is disposed with a second connecting portion 212; any two adjacent capacitor plates 221 arranged along the second direction Y are electrically connected through the second connecting portion 212, and the capacitor plate 221 is connected to the power supply voltage signal input terminal.

In one embodiment, the connecting metal layer may be a newly-added metal layer that is separately disposed, or other metal layers may be multiplexed as the connecting metal layer, which is not limited hereto, and it can be set according to actual conditions.

It can be understood that, as the connecting metal layer is located between the first metal layer 22 and the base substrate 10, in the preparation of the array substrate 1, the processes of the connection metal layer are earlier than those of the first metal layer 22. After the first metal layer 22 is prepared, the capacitor plates 221 are not in a floated state, instead, they are connected to the power voltage signal input end to form electrostatic discharge channels, so that the static charges on the capacitor plate 221 can be exported, therefore, problems of a large amount of static charges accumulated on the capacitor plate 221 and a large difference in the amount of the accumulated static charges may not occur, so that there is no split-screen.

Figure 18:
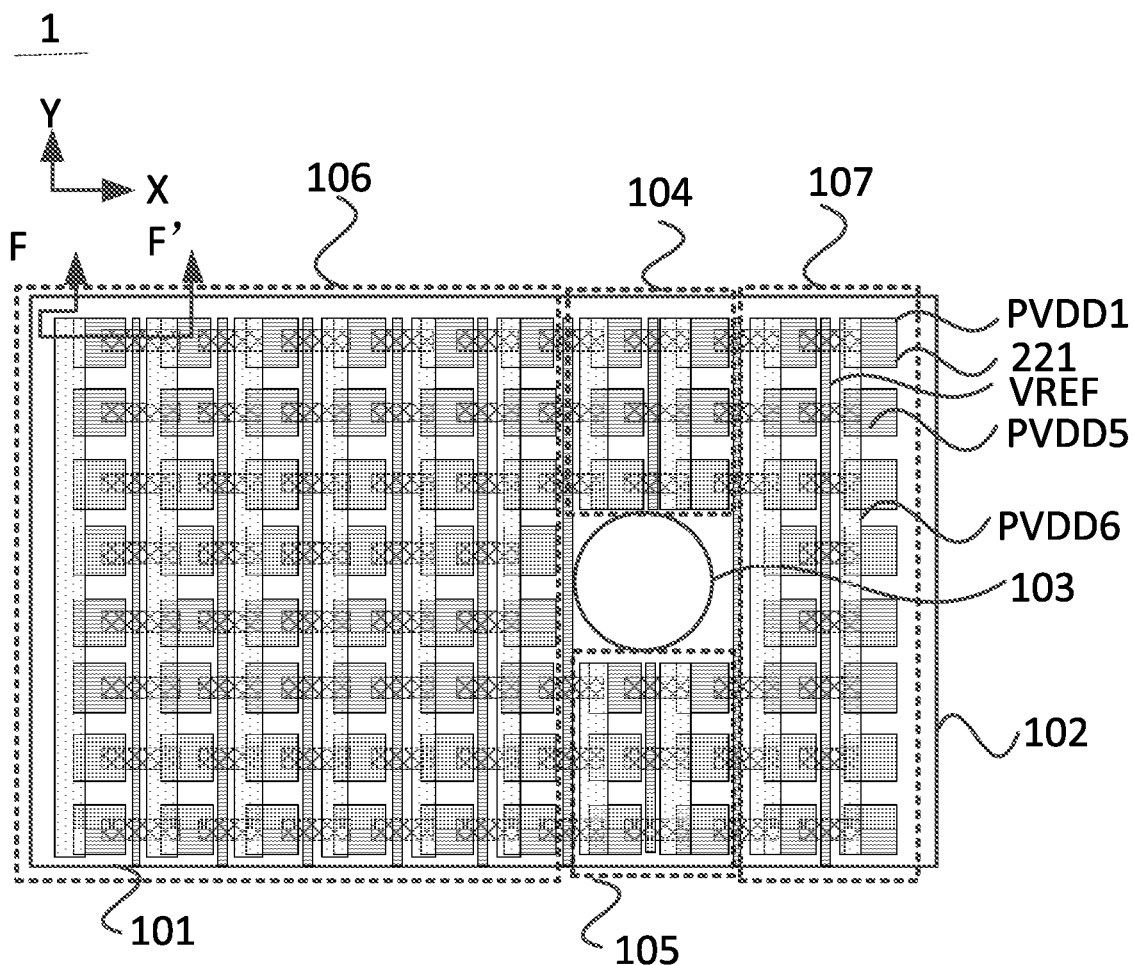
FIG. 18 is a schematic structure view of an array substrate provided by an embodiment of the present disclosure.
Figure 19:
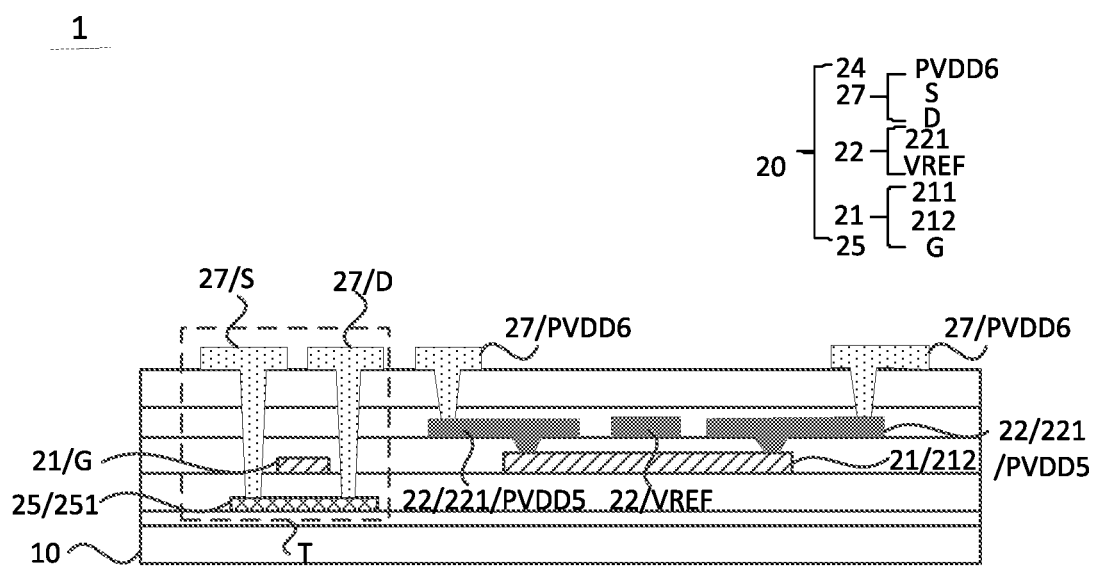
FIG. 19 is a cross-sectional view along the FF' direction of FIG. 18.

FIG. 18 is a schematic structure view of an array substrate provided by an embodiment of the present disclosure. FIG. 19 is a cross-sectional view along the FF' direction of FIG. 18. With reference to FIG. 18 and FIG. 19, in an embodiment, the gate metal layer 21 is multiplexed as a connecting metal layer. In this way, there is no need to separately dispose a connecting metal layer, and to reduce the support and realize thinning of the array substrate 1.

Also with reference to FIG. 18 and FIG. 19, the drive circuit layer 20 further includes a fifth metal layer 27 located on a side of the first metal layer 22 facing away from the base substrate 10; the plurality of capacitor plates 221 arranged along the second direction Y and those are electrically connected to each other are multiplexed into as fifth power signal line PVDD5, and the plurality of fifth power signal lines PVDD5 are arranged along the first direction X; the fifth metal layer 27 includes sixth power signal lines PVDD6, the sixth power signal line PVDD6 extends along the first direction X, and the plurality of sixth power signal lines PVDD6 are arranged along the second direction Y; the sixth power supply signal line PVDD6 and the fifth power supply signal line PVDD5 are connected to the same power supply voltage signal input terminal.

In one embodiment, the embodiment in which the sixth power signal line PVDD6 and the fifth power signal line PVDD5 that is are connected to the same power supply voltage signal input terminal can be set according to actual conditions, which is not limited hereto. Exemplarily, the sixth power supply signal line PVDD6 may be connected to the fifth power supply signal line PVDD5 through punching a hole.

It can be understood that, capacitor plates 221 arranged along the second direction Y and electrically connected to each other are multiplexed as the fifth power signal line PVDD5, and there is no need to separately provide the fifth power signal line PVDD5, which can simplify preparation of the array substrate 1 and improve efficiency.

It can also be understood that, by disposing the fifth power signal line PVDD5 and the sixth power signal line PVDD6 to cross to form a grid shape, the signal lines used for transmitting the power signal can be more evenly distributed in the array substrate 1, which can realize the uniformity of the power supply signal, and reduce the voltage drop of the power signal line.

Also with reference to FIG. 18 and FIG. 19, in an embodiment, the drive circuit layer 20 further includes an initialization signal line VREF, the initialization signal line VREF extends along the second direction Y, and initialization signal lines VREF are disposed along the first direction X; the initialization signal line VREF is disposed on the first metal layer 22.

It can be understood that, by disposing the initialization signal line VREF and the fifth power signal line PVDD5 to be positioned at the same layer, there is no need to separately arrange a metal layer for the initialization signal line VREF, so that the number of film layers of the array substrate 1 can be reduced, and simplifying preparation of the array substrate 1, and to improve production efficiency and facilitate the thinning of the array substrate 1.

It should be noted that, FIG. 18 only exemplarily shows another capacitor plate 211 provided with the gate G, the storage capacitor Cst on the gate metal layer 21, and the second connection portion 212 of the fifth power signal line PVDD5, the first metal layer 22 is provided with a capacitor plate 221 (the fifth power supply signal line PVDD5) and an initialization signal line VREF, and the fifth metal layer 27 is provided with a sixth power supply signal line PVDD6, a source electrode S and a drain electrode D, but it is not limited hereto, it can be set the structure included in each metal layer according to actual conditions; exemplarily, the gate metal layer 21 may be further provided with a gate scan line, and the fifth metal layer 27 may be further provided with a data signal line DATA.

Figure 20:
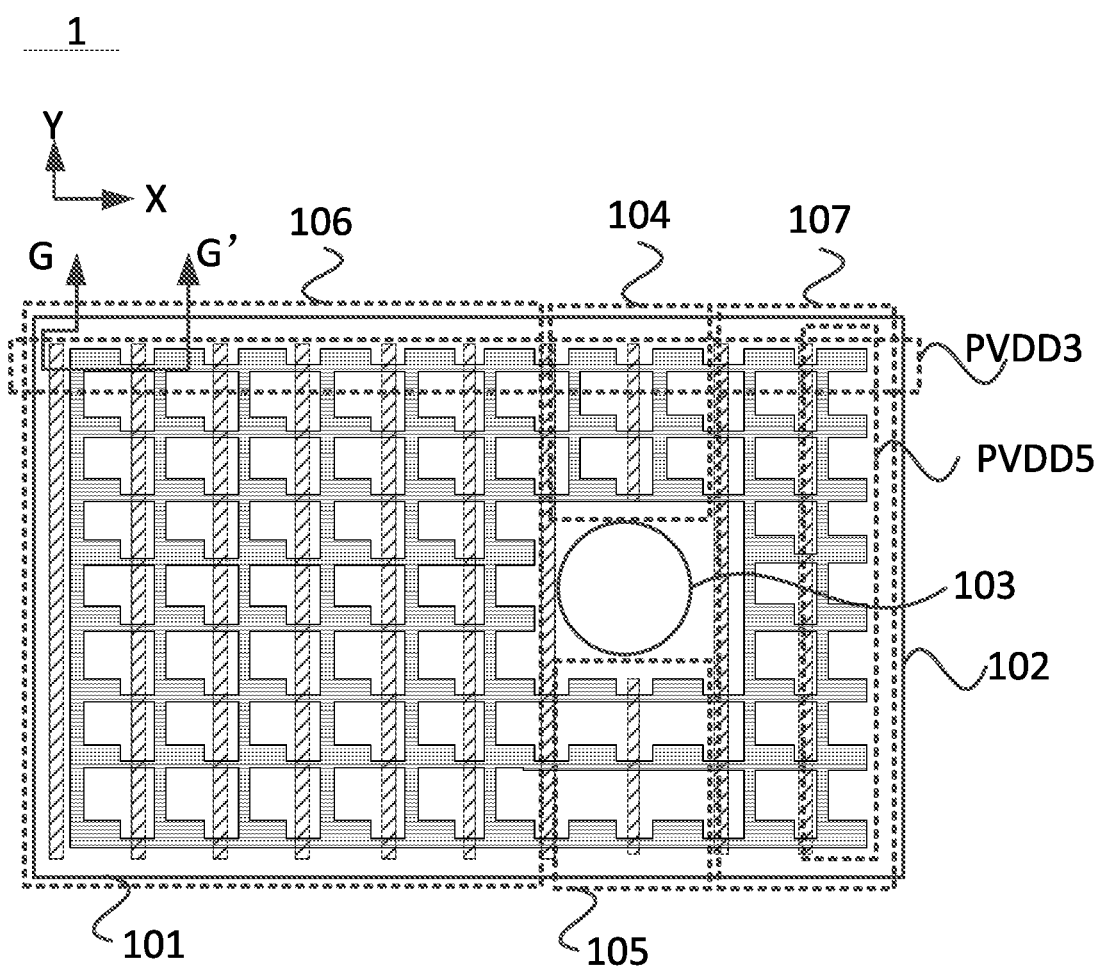
FIG. 20 is a schematic structure view of another array substrate provided by an embodiment of the present disclosure.
Figure 21:
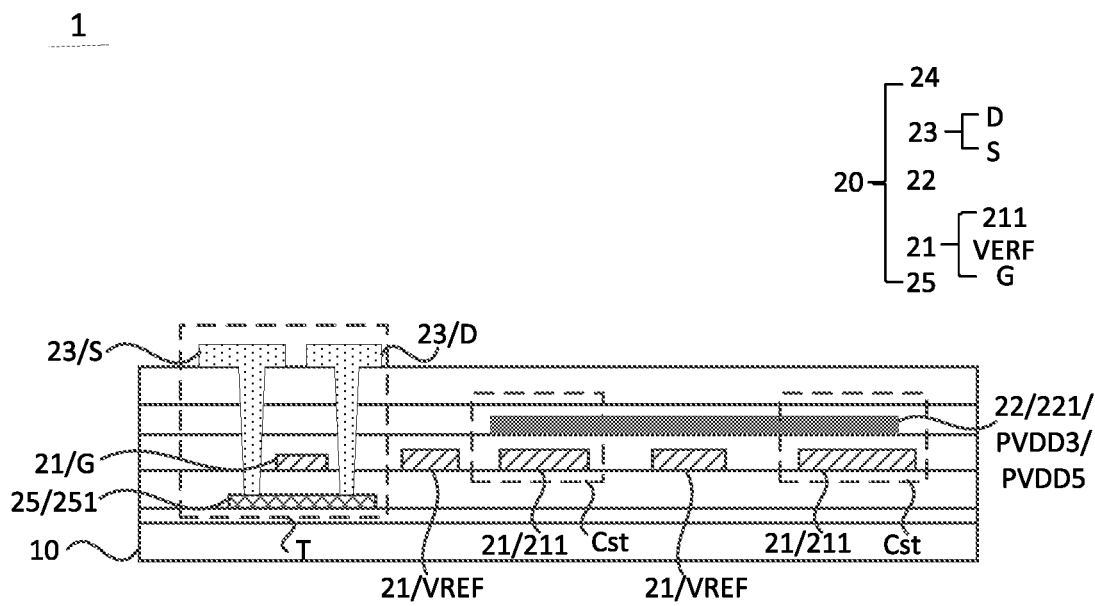
FIG. 21 is a cross-sectional view along the GG' direction of FIG. 20.

FIG. 20 is a schematic structure view of another array substrate provided by an embodiment of the present disclosure. FIG. 21 is a cross-sectional view along the GG' direction of FIG. 20. With reference to FIG. 20 and FIG. 21, in an embodiment, two adjacent capacitor plates 221 arranged along the first direction X are electrically connected, the plurality of capacitor plates 221 arranged along the first direction X and those are electrically connected to each other are multiplexed into the third power signal line PVDD3, and the plurality of third power signal lines PVDD3 are arranged along the second direction Y; the plurality of capacitor plates 221 arranged along the second direction Y and those are electrically connected to each other are multiplexed into the fifth power signal line PVDD5, and the plurality of fifth power signal lines PVDD5 are arranged along the second direction Y; the third power supply signal line PVDD3 and the fifth power supply signal line PVDD5 are connected to the same power supply voltage signal input terminal.

It can be understood that, after preparation of the first metal layer 22 is completed, the capacitor plates 221 are not in a floated state, instead, they are connected to the power supply voltage signal input terminal to form electrostatic discharge channels, and the static charges on the capacitor plates 221 can be exported; thus, the problems of a large amount of static charges accumulated on the capacitor plate 221 and a large difference in the amount of the accumulated static charges may not exist, and split-screens may not occur.

It can also be understood that, the plurality of capacitor plates 221 arranged along the first direction X and those are electrically connected to each other are multiplexed into the third power signal line PVDD3, and the plurality of capacitor plates 221 arranged along the second direction Y and those are electrically connected to each other are multiplexed into the fifth power signal line PVDD5, there is no need to provide the third power signal line PVDD3 and the fifth power signal line PVDD5 separately, which can simplify manufacturing process of the array substrate 1 and improve efficiency. Meanwhile, by disposing the third power signal line PVDD3 and the fifth power signal line PVDD5 to cross to form a grid shape, the signal lines for transmitting the power signal can be more evenly distributed in the array substrate 1, which can realize the uniformity of the power signal, and reduce the voltage drop of the power signal line.

With reference to FIG. 20 and FIG. 21, in an embodiment, the drive circuit layer 20 further includes an initialization signal line VREF, the initialization signal line VREF extends along the second direction Y, and initialization signal lines VREF are arranged along the first direction X; the initialization signal line VREF is positioned on the gate metal layer 21.

It can be understood that, in the display panel provided by the related art, the initialization signal line VREF extending along the second direction Y is usually provided on the first metal layer 22; while in an embodiment of the present disclosure, the third power signal line PVDD3 disposed on the first metal layer 22 extends along the first direction X, the initialization signal line VREF can be moved to the gate metal layer 21, which can prevent the initialization signal line VREF and the third power signal line PVDD3 from being crossed and leading to short circuit. It can also be understood that, the initialization signal line VREF is moved to the gate metal layer 21, so that the first metal layer 22 does not need to reserve a position for the initialization signal line VREF, the area of the capacitor plate 221 can be enlarged to occupy the position originally reserved for the initialization signal line VREF. In this way, the area of the capacitor plates 221 can be increased, and, the storage capacity of the storage capacitor Cst formed by the capacitor plates 221 is increased, meanwhile, the capacitor plates 221 with larger area can play a better signal-shielding role and prevent interference.

It should be noted that, FIG. 20 only exemplarily shows another capacitor plate 211 provided with a gate G, a storage capacitor Cst, and an initialization signal line VREF on the gate metal layer 21, the first metal layer 22 is provided with capacitor plates 221 (the third power signal line PVDD5 and the fifth power signal line PVDD5), the second metal layer 23 is provided with the source electrode S and the drain electrode D, but it is not limited hereto, it can be set the structure included in each metal layer according to actual situations, exemplarily, a gate scan line may be further provided on the gate metal layer 21, and a data signal line DATA may be further provided at the second metal layer 23.

It should be noted that, FIG. 8, FIG. 11, FIG. 13, FIG. 16, FIG. 18, and FIG. 20 only exemplarily show that the array substrate further includes a semiconductor layer 25 on the side of the gate metal layer 21 facing the base substrate 10, the semiconductor layer 25 is provided with the active layer 251 of T with the thin film transistor, but it is not limited hereto, it can be set the film layers In one embodiment included in the array substrate and the relative positions between the film layers according to actual conditions. In addition, FIG. 14, FIG. 15, FIG. 19 and FIG. 21 only exemplarily show that the signal line is interrupted in the component disposing area, but it is not limited hereto, the signal lines can also be disposed on both sides of the component disposing area to bypass the component disposing area while remaining continuous.

It should also be noted that, in order to clearly show the differences between various components of the array substrate 1 in the embodiment of the present disclosure and those in the related art, components of the same name in the array substrate 1 in the embodiment of the present disclosure and those in the related art are marked differently in the drawings. It should also be noted that, materials and preparation of the metal layers of the array substrate 1 and the insulating layers between adjacent metal layers in the embodiment can be set according to actual conditions, which is not limited hereto.

An embodiment of the present disclosure also provides a display panel, the display panel includes the array substrate described in any of the above-mentioned embodiments. Thus, the display panel has the same beneficial effects as the array substrate, which can be understood with reference to the above and may not be discussed in detail here.

Figure 22:
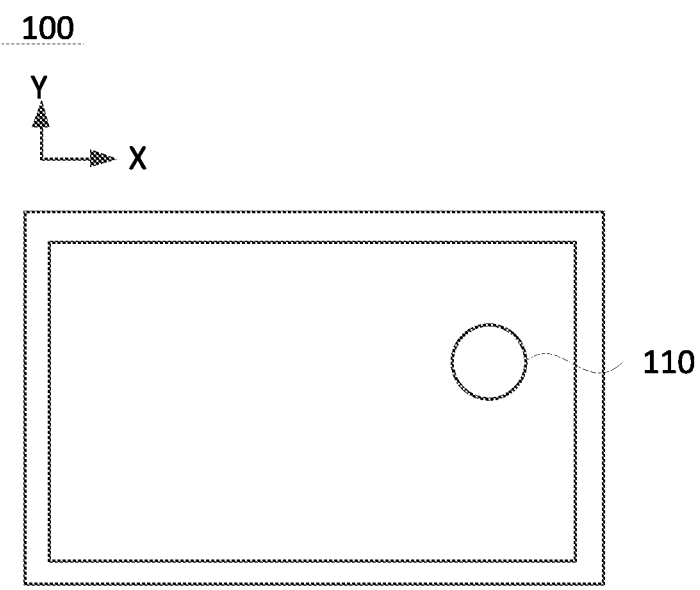
FIG. 22 is a schematic structure view of a display panel provided by an embodiment of the present disclosure.

Exemplarily, FIG. 22 is a schematic structure view of a display panel provided by an embodiment of the present disclosure. With reference to FIG. 22, the display panel includes a component accommodating cavity 110, where the component accommodating cavity 110 can be obtained by opening a through hole or a blind hole at a corresponding position of the component disposing area of the array substrate. In an embodiment, the display panel may also be a display panel in which the component disposing area with pixel units, light transmittance of the component disposing area is greater than that of other areas in the display panel.

An embodiment of the present disclosure also provides a display device, which includes the display panel described in any of the above-mentioned embodiments, and further includes an imaging component, which is disposed in the opening. Thus, the display panel has the same beneficial effects as the array substrate, which can be understood with reference to the above and may not be discussed in detail here.

Figure 23:
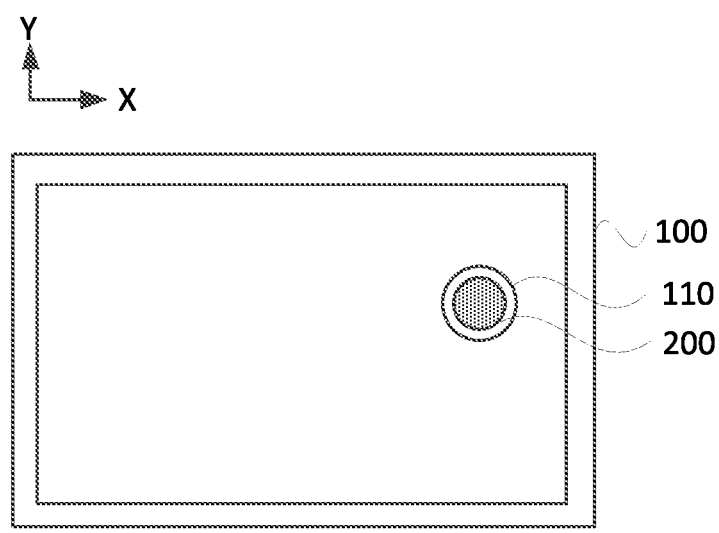
FIG. 23 is a schematic structure view of a display device provided by an embodiment of the present disclosure.

Exemplarily, FIG. 23 is a schematic structure view of a display device provided by an embodiment of the present disclosure. As shown in FIG. 23, the display device provided by the embodiment of the present disclosure includes the display panel 100 and the imaging component 200 provided by the embodiment of the present disclosure, in a direction perpendicular to the plane where the display panel is located, the imaging component 200 and the component disposing area 110 at least overlap. Exemplarily, the display device may be any electronic device with a display function, such as a touch screen, a mobile phone, a tablet computer, a notebook computer, or a television.

What is claimed is:

1. An array substrate mother board, comprising:
   a plurality of array substrates arranged in an array, wherein each array substrate of the plurality of array substrates comprise a first boundary extending along a first direction and a second boundary extending along a second direction, and the first direction intersects the second direction;
   each array substrate comprises a component disposing area;
   each array substrate further comprises a base substrate and a drive circuit layer, wherein the drive circuit layer comprises a gate metal layer and a first metal layer, the first metal layer is disposed on a side of the gate metal layer facing away from the base substrate, and the first metal layer comprises a plurality of capacitor plates arranged in an array along the first direction and along the second direction;
   the plurality of array substrates comprises a plurality of first-type array substrates, and the plurality of first-type array substrates are arranged along the first direction and are adjacent to a boundary extending along the first direction in the array substrate mother board; and
   among the plurality of first-type array substrates, along the second direction, two sides of the component disposing area comprise a first sub-area and a second sub-area, the first sub-area and the second sub-area each comprise a plurality of capacitor plates, and along the second direction, any two capacitor plates of the plurality of capacitor plates in the first sub-area and the second sub-area are not connected on the first metal layer.

2. The array substrate mother board of claim 1, wherein the plurality of array substrates comprise a plurality of second-type array substrates, the plurality of second-type array substrates are arranged along the second direction and are adjacent to a boundary extending along the second direction and in the array substrate mother board;
   among the plurality of second-type array substrates, along the first direction, two sides of the component disposing area comprise a third sub-area and a fourth sub-area, wherein the third sub-area and the fourth sub-area comprise a plurality of the capacitor plates, and along the first direction, any two capacitor plates of the plurality of the capacitor plates in the third sub-area and the fourth sub-area are not connected on the first metal layer.

3. The array substrate mother board of claim 1, wherein in any one array substrate of the plurality of array substrates, among a plurality of capacitor plates respectively disposed on two sides of the component disposing area and along the second direction, any two capacitor plates are disposed on two sides of the component disposing area, are not connected on a plane where the first metal layer is located.

4. An array substrate, comprising:
   a first boundary extending along a first direction and a second boundary extending along a second direction, wherein the first direction intersects the second direction;
   the array substrate comprises a component disposing area;
   the array substrate further comprises a base substrate and a drive circuit layer, wherein the drive circuit layer comprises a gate metal layer and a first metal layer, the first metal layer is disposed on a side of the gate metal layer facing away from the base substrate, and the first metal layer comprises a plurality of capacitor plates arranged in an array along the first direction and along the second direction; and
   in the array substrate, along the second direction, two sides of the component disposing area comprise a first sub-area and a second sub-area, the first sub-area and the second sub-area each comprise a plurality of the capacitor plates, and along the second direction, any two capacitor plates of the plurality of the capacitor plates in the first sub-area and the second sub-area are not connected on the first metal layer.

5. The array substrate of claim 4, wherein the any two capacitor plates arranged along the second direction are not connected on a plane where the first metal layer is located.

6. The array substrate of claim 5, wherein the any two capacitor plates arranged along the second direction are disposed insulatedly.

7. The array substrate of claim 6, wherein along the first direction and along the second direction, at the first metal layer, any two capacitor plates are disposed insulatedly.

8. The array substrate of claim 7, wherein the drive circuit layer further comprises:
   a second metal layer disposed on a side of the first metal layer facing away from the base substrate and a third metal layer on a side of the second metal layer facing away from the base substrate;
   the second metal layer comprises a plurality of first power signal lines, the plurality of first power signal lines extend along the first direction, and the plurality of first power signal lines are arranged along the second direction; and
   the third metal layer comprises a plurality of second power signal lines, the plurality of second power signal lines extend along the second direction, the plurality of second power signal lines are arranged along the first direction, and the plurality of second power signal lines and the plurality of second power signal lines are connected to a same power supply voltage signal input terminal.

9. The array substrate of claim 6, wherein two adjacent capacitor plates arranged along the first direction are electrically connected.

10. The array substrate of claim 9, wherein the drive circuit layer further comprises:
a fourth metal layer disposed on a side of the first metal layer facing away from the base substrate;
a plurality of capacitor plates of the fourth metal layer arranged along the first direction and electrically connected to each other are multiplexed as a third power signal line, and a plurality of third power signal lines are arranged along the second direction; and
the fourth metal layer comprises a plurality of fourth power signal lines, the plurality of fourth power signal lines extend along the second direction, the plurality of fourth power signal lines are arranged along the first direction, and the plurality of third power signal lines and the plurality of fourth power signal lines are connected to a same power supply voltage signal input terminal.

11. The array substrate of claim 10, wherein a fourth power signal line comprises:
a wiring portion and a first connecting portion, wherein the wiring portion is disposed on the fourth metal layer, and the first connecting portion is disposed on the first metal layer; and
the wiring portion extends along the second direction, and two adjacent wiring portions along the second direction are electrically connected through the first connecting portion.

12. The array substrate of claim 10, wherein the drive circuit layer further comprises:
an initialization signal line, the initialization signal line extends along the second direction, and a plurality of initialization signal lines are arranged along the first direction; and
the initialization signal line is disposed on the gate metal layer.

13. The array substrate of claim 5, wherein the drive circuit layer further comprises:
a connecting metal layer disposed between the base substrate and the first metal layer, and the connecting metal layer is provided with a second connecting portion; and
any two adjacent capacitor plates arranged along the second direction are electrically connected through the second connecting portion, and the any two adjacent capacitor plates are connected to a power supply voltage signal input terminal.

14. The array substrate of claim 13, wherein the gate metal layer is multiplexed as the connecting metal layer.

15. The array substrate of claim 14, wherein two adjacent capacitor plates arranged along the first direction are electrically connected, a plurality of capacitor plates arranged along the first direction and electrically connected to each other are multiplexed as third power signal lines, and a plurality of third power signal lines are arranged along the second direction; and
a plurality of capacitor plates arranged along the second direction and electrically connected to each other are multiplexed as fifth power signal lines, a plurality of fifth power signal lines are arranged along the second direction, and the plurality of third power signal lines and the plurality of fifth power signal lines are connected to a same power supply voltage signal input terminal.

16. The array substrate of claim 15, wherein the drive circuit layer further comprises:
an initialization signal line, the initialization signal line extends along the second direction, and a plurality of initialization signal lines are arranged along the first direction; and
the initialization signal line is disposed on the gate metal layer.

17. The array substrate of claim 13, wherein the drive circuit layer further comprises:
a fifth metal layer disposed on a side of the first metal layer facing away from the base substrate;
a plurality of the capacitor plates of the fifth metal layer arranged along the second direction and electrically connected to each other are multiplexed as a fifth power signal line, and a plurality of fifth power signal lines are arranged along the first direction; and
the fifth metal layer comprises a plurality of sixth power signal lines, the plurality of sixth power signal lines extend along the first direction, the plurality of sixth power signal lines are arranged along the second direction, and the plurality of fifth power signal lines and the plurality of sixth power signal lines are connected to a same power supply voltage signal input terminal.

18. The array substrate of claim 17, wherein the drive circuit layer further comprises:
an initialization signal line, the initialization signal line extends along the second direction, and a plurality of initialization signal lines are arranged along the first direction; and
the initialization signal line is disposed on the first metal layer.

19. A display panel, comprising an array substrate, wherein the array substrate comprises:
a first boundary extending along a first direction and a second boundary extending along a second direction, wherein the first direction intersects the second direction;
the array substrate comprises a component disposing area;
the array substrate further comprises a base substrate and a drive circuit layer, wherein the drive circuit layer comprises a gate metal layer and a first metal layer, the first metal layer is disposed on a side of the gate metal layer facing away from the base substrate, and the first metal layer comprises a plurality of capacitor plates arranged in an array along the first direction and along the second direction; and
in the array substrate, along the second direction, two sides of the component disposing area comprise a first sub-area and a second sub-area, the first sub-area and the second sub-area each comprise a plurality of the capacitor plates, and along the second direction, any two capacitor plates of the plurality of the capacitor plates in the first sub-area and the second sub-area are not connected on the first metal layer.

20. A display device, comprising:
comprising the display panel of claim 19,
and further comprising an imaging component, in a direction perpendicular to a plane where the display panel is located, the imaging component at least partially overlaps the component disposing area.

* * * * *